(12) United States Patent
Ariji et al.

(10) Patent No.: US 9,018,825 B2
(45) Date of Patent: Apr. 28, 2015

(54) PIEZOELECTRIC DEVICE AND MANUFACTURING METHOD OF PIEZOELECTRIC DEVICE

(75) Inventors: Takumi Ariji, Saitama (JP); Kunio Morita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 267 days.

(21) Appl. No.: 13/434,836

(22) Filed: Mar. 29, 2012

(65) Prior Publication Data
US 2012/0248940 A1     Oct. 4, 2012

(30) Foreign Application Priority Data

Mar. 30, 2011   (JP) .................................. 2011-075237
Mar. 15, 2012   (JP) .................................. 2012-058933

(51) Int. Cl.
*H03H 9/02*     (2006.01)
*H03H 9/10*     (2006.01)
*H03H 9/05*     (2006.01)

(52) U.S. Cl.
CPC ........... *H03H 9/1021* (2013.01); *H03H 9/0595* (2013.01); *H03H 9/1035* (2013.01)

(58) Field of Classification Search
USPC ............. 310/348, 344, 349, 311, 365, 313 B, 310/313 C, 313 R, 366, 367, 368, 369, 320, 310/321, 351
See application file for complete search history.

(56) References Cited

U.S. PATENT DOCUMENTS

| | | | | |
|---|---|---|---|---|
| 8,541,929 | B2 * | 9/2013 | Ono et al. | 310/348 |
| 8,686,803 | B2 * | 4/2014 | Ariji et al. | 331/158 |
| 2012/0306320 | A1 * | 12/2012 | Ichikawa et al. | 310/344 |
| 2013/0106247 | A1 * | 5/2013 | Ariji et al. | 310/348 |

FOREIGN PATENT DOCUMENTS

| | | | | |
|---|---|---|---|---|
| JP | 2002-270708 | | 9/2002 | |
| JP | 2012-217155 | * | 11/2012 | H03H 9/02 |

* cited by examiner

*Primary Examiner* — Thomas Dougherty
*Assistant Examiner* — Karen B Addison
(74) *Attorney, Agent, or Firm* — Jianq Chyun IP Office

(57) ABSTRACT

A piezoelectric device, in which one of a first plate, a second plate, and an adhesive agent is colored for confirming a bonding status of the adhesive agent, and a manufacturing method thereof, are provided. A piezoelectric device includes a piezoelectric vibrating piece that vibrates by applying a voltage; a first plate and a second plate formed of glass and seal the piezoelectric vibrating piece; and an adhesive agent which bonds the first plate with the second plate, wherein one of the first plate, the second plate, and the adhesive agent is colored.

8 Claims, 21 Drawing Sheets

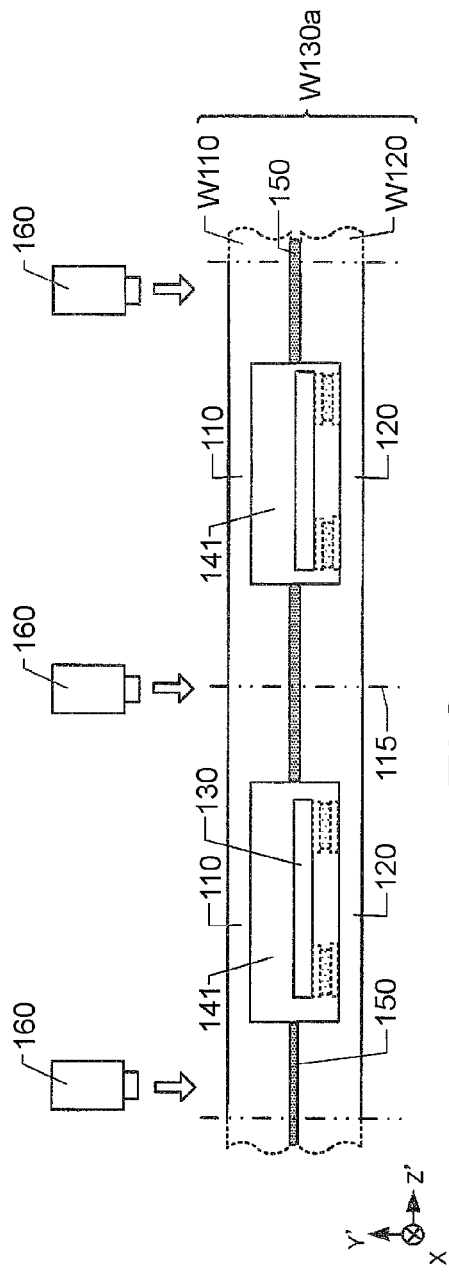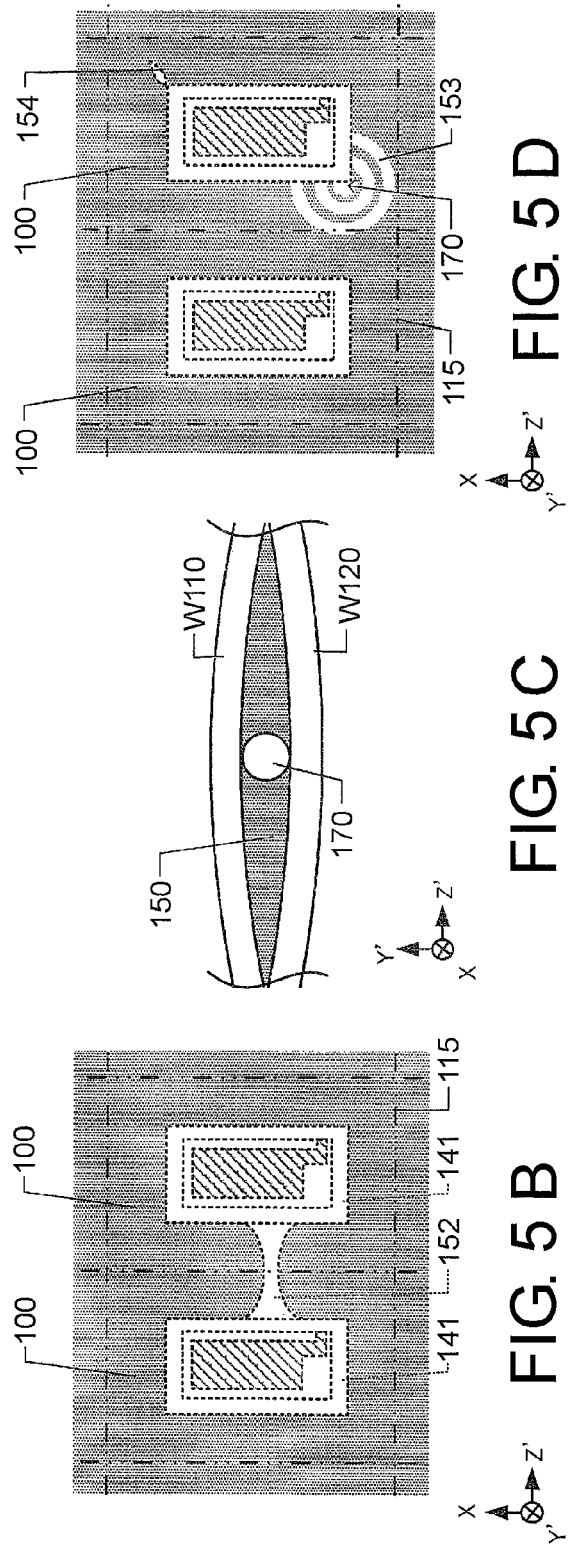
FIG. 5A
FIG. 5B
FIG. 5C
FIG. 5D

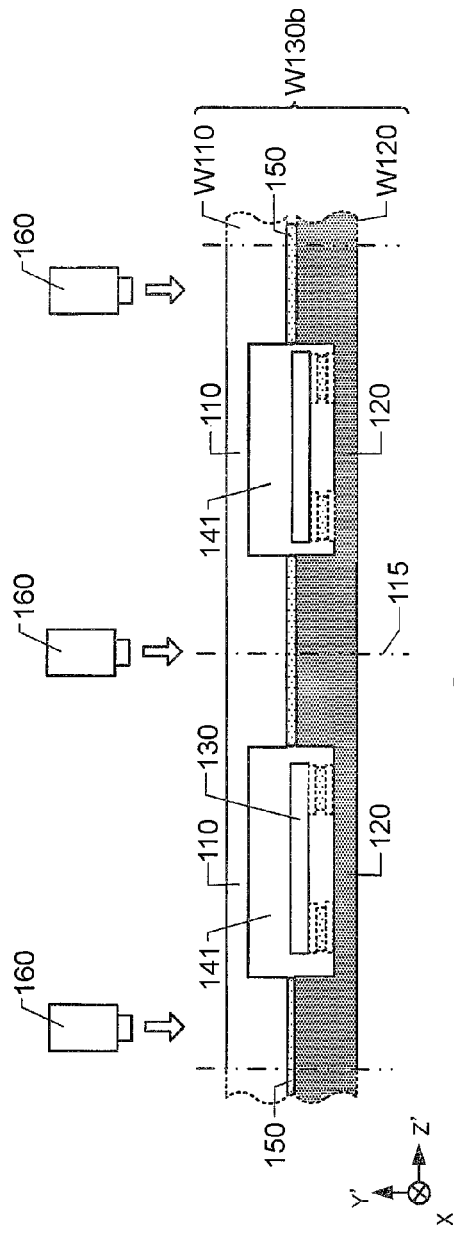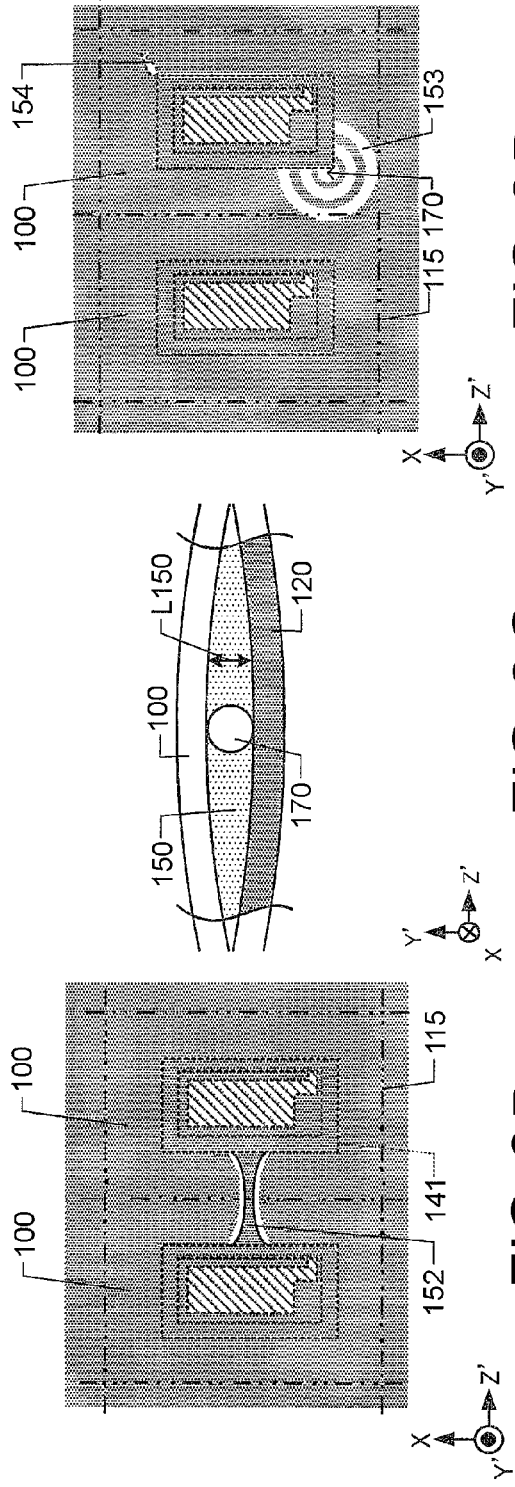

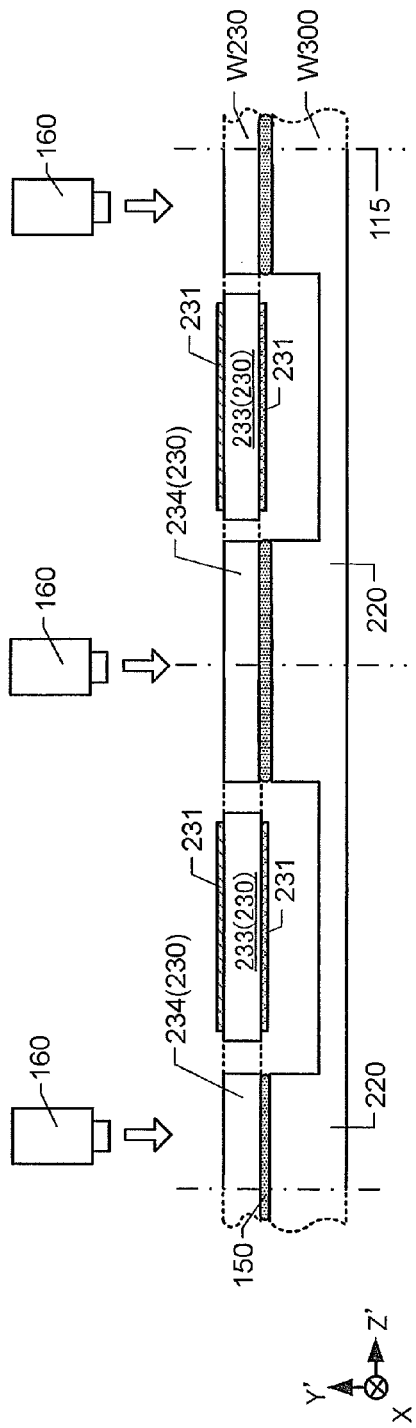
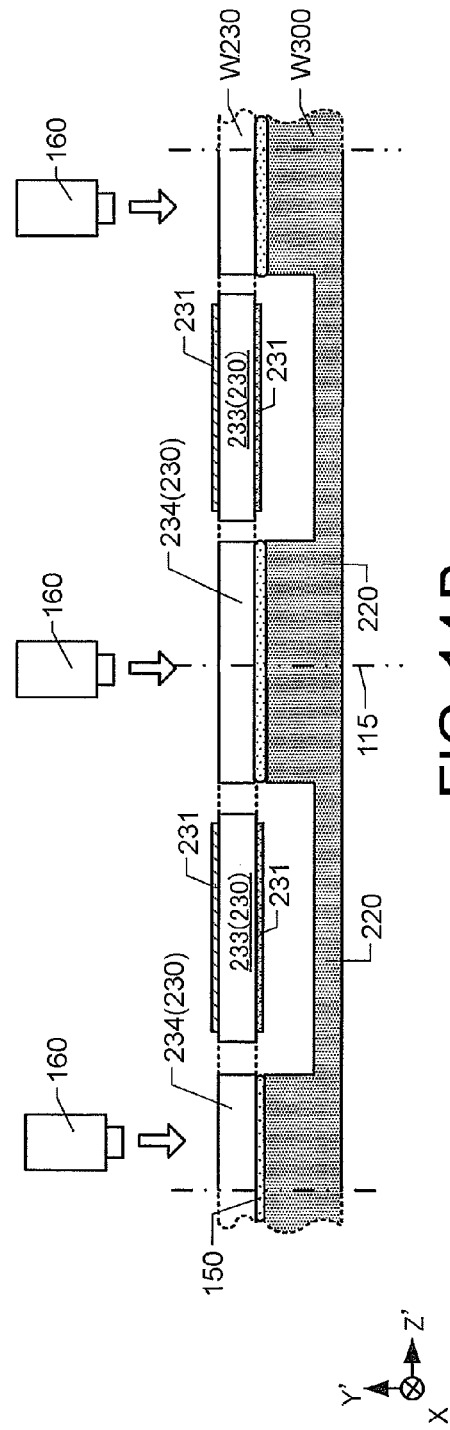
FIG. 14A
FIG. 14B

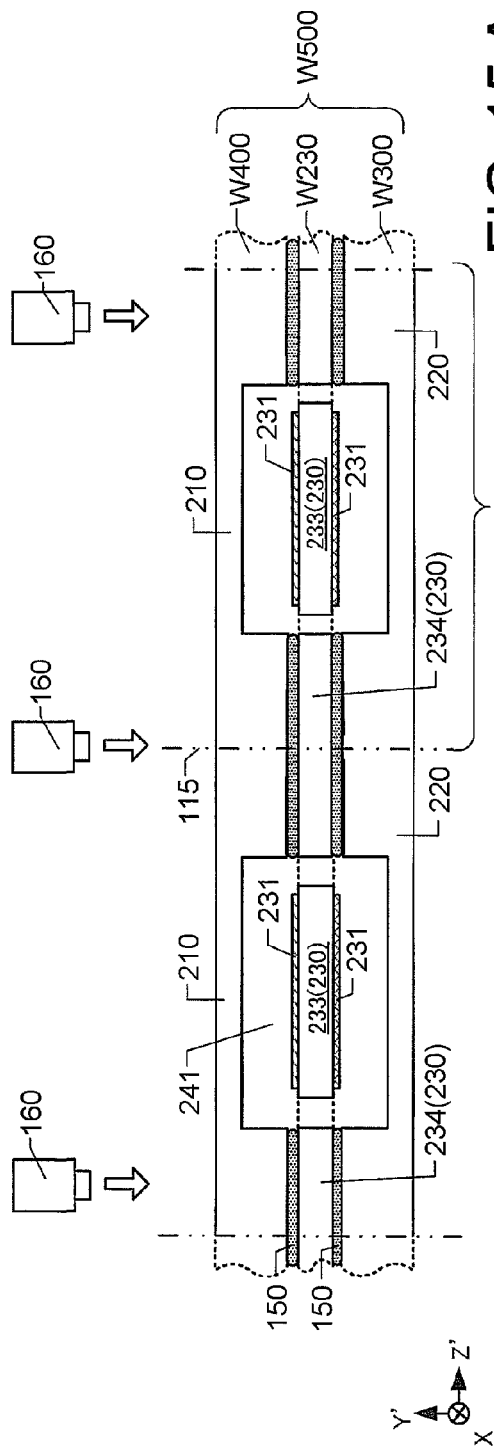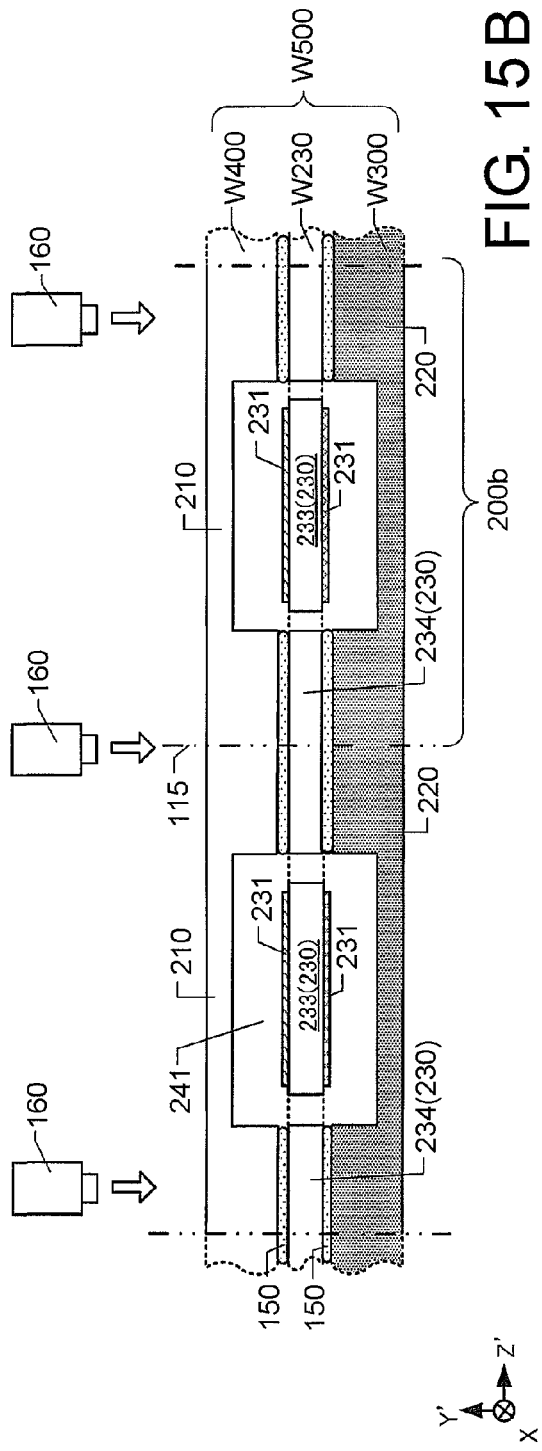

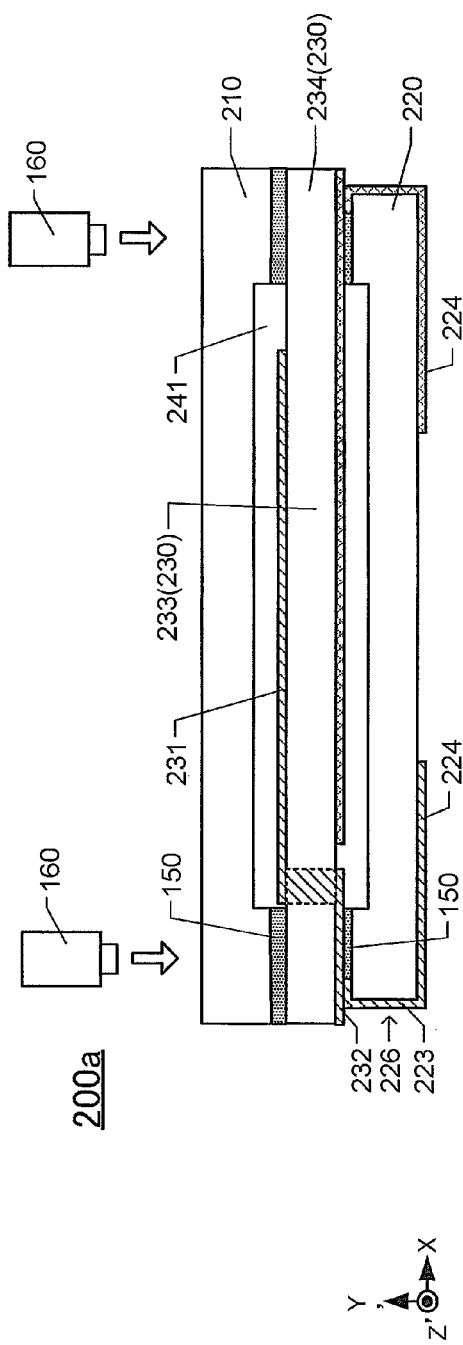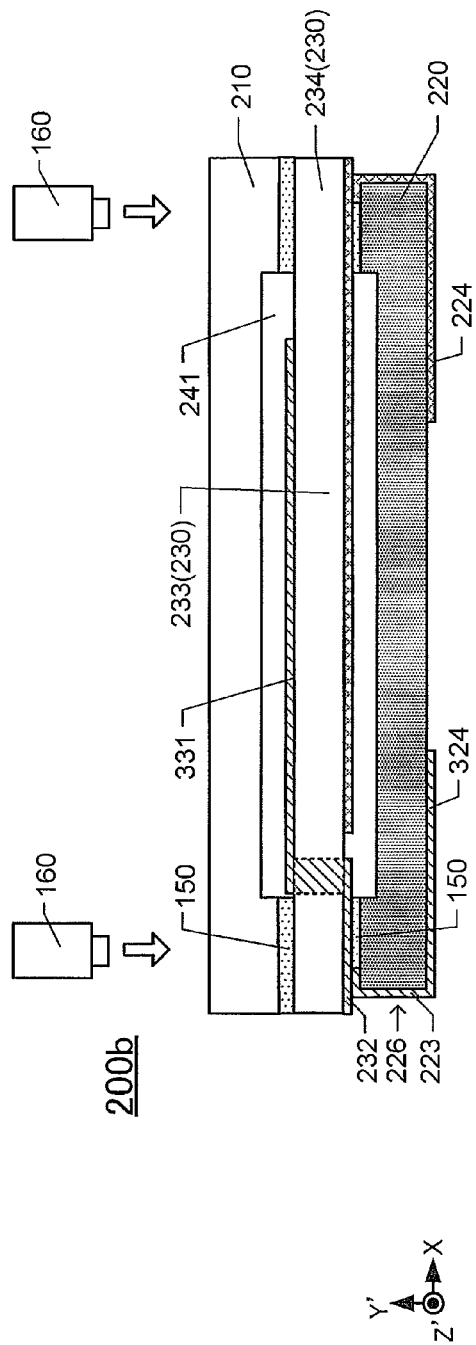

PIEZOELECTRIC DEVICE AND MANUFACTURING METHOD OF PIEZOELECTRIC DEVICE

CROSS-REFERENCE TO RELATED APPLICATIONS

This application claims the priority benefit of Japan application Ser. No. 2011-075237, filed on Mar. 30, 2011, and Japan application Ser. No. 2012-058933, filed on Mar. 15, 2012. The entirety of each of the above-mentioned patent applications is hereby incorporated by reference herein and made a part of this specification.

BACKGROUND OF THE INVENTION

1. Field of the Invention

The present invention relates to piezoelectric devices and manufacturing method thereof, wherein one of a lid, a base, and an adhesive agent of the piezoelectric device is colored.

2. Description of the Related Art

A piezoelectric device is known to have a piezoelectric vibrating piece, disposed in a cavity formed by two glass plates or crystal plates, and vibrates when voltage is applied. The cavity in the piezoelectric device is sealed and formed by bonding the two glass plates or crystal plates to each other with an adhesive agent. The hermetic seal of the cavity is impaired due to the defective bonding of the glass plates or crystal plates. Consequently, such piezoelectric devices become an inferior product. From the aspect of product quality management, the inspection of inferior products is preferably carried out either during the manufacturing process of the piezoelectric devices or after completing the production. Because the glass plates and crystal plates are highly transparent, the bonding part of the adhesive agent can be observed to confirm defect in the bonding portion directly after forming the cavity. However, because of the high transparency, various lights may pass through the glass plates or crystal plates. As a result, it is difficult to clearly observe and identify the bonding defect.

In terms of identifying inferior products, for example, Patent Reference 1 discloses an inspection method. The method utilizes the difference in optical transmittance to inspect the quality products and the inferior products of lid stock used for sealing electronic parts. According to this inspection method, the difference between the optical transmittances of the quality products and the inferior products is enhanced by coloring the adhesive agent formed in the lid stock used for sealing the electronic part, so as to find out the inferior products.

RELATED ART

Patent Reference

[Patent Reference 1] JP 2002-270708

Problem to be Solved by the Invention

However, in the Patent Reference 1, the defective lid stock is inspected only, and the defective bonding of the adhesive agent is not inspected. In addition, for a piezoelectric device, it is considered difficult to inspect defective bonding by only inspecting the difference of optical transmittance.

SUMMARY OF THE INVENTION

Accordingly, the invention provides a piezoelectric device, which facilitates the inspection of a bonding status of an adhesive agent by coloring one of a lid, a base, and the adhesive agent, and a manufacturing method of the piezoelectric device.

Solution to the Problem

According to the first aspect of the disclosure, a piezoelectric device, including a piezoelectric vibrating piece that vibrates by applying a voltage; and a first plate and a second plate that are formed of glass and hermetically seal the piezoelectric vibrating piece, is provided, wherein the first plate or the second plate is colored, and the first plate and the second plate are bonded to each other.

According to the second aspect of the disclosure, on the basis of the first aspect, a surface of the first plate and a surface of the second plate are activated and directly bonded to each other.

According to the third aspect of the disclosure, on the basis of the first aspect, the first plate and the second plate are bonded via an adhesive agent.

According to the fourth aspect of the disclosure, a piezoelectric device, including a piezoelectric vibrating piece that vibrates by applying a voltage; a first plate and a second plate that are formed of crystal or glass and hermetically seal the piezoelectric vibrating piece; and an adhesive agent that bonds the first plate with the second plate, is provided, wherein the adhesive agent is colored.

According to the fifth aspect of the disclosure, a piezoelectric device including a piezoelectric vibrating piece having a piezoelectric vibrating portion that vibrates by applying a voltage and a frame body that surrounds the piezoelectric vibrating portion; a first plate and a second plate that are formed of glass, bonded to two principal surfaces of the frame body of the piezoelectric vibrating piece, and seal the piezoelectric vibrating portion; and an adhesive agent that bonds the first plate, the frame body, and the second plate, is provided, wherein one of the first plate, the second plate, and the adhesive agent is colored.

According to the sixth aspect of the disclosure, the invention provides a piezoelectric device, including a piezoelectric vibrating piece having a piezoelectric vibrating portion that vibrates by applying a voltage and a frame body that surrounds the piezoelectric vibrating portion; a first plate and a second plate that are formed of crystal, bonded to two principal surfaces of the frame body of the piezoelectric vibrating piece, and seal the piezoelectric vibrating portion; and an adhesive agent that bonds the first plate, the frame body, and the second plate, is provided, wherein the adhesive agent is colored.

According to the seventh aspect of the disclosure, on the basis of the first to the sixth aspects, the adhesive agent of the piezoelectric device is a low-melting-point glass that melts between 350° C. to 410° C.

According to the eighth aspect of the disclosure, on the basis of the first to the seventh aspects, a color used for the coloring absorbs over 50% wavelength of an incident visible light.

According to the ninth aspect of the disclosure, a manufacturing method of a piezoelectric device is provided, the step includes: preparing a plurality of piezoelectric vibrating pieces that vibrates by applying a voltage; preparing a first wafer that is formed of glass and having a plurality of first plates, and a second wafer that is formed of glass and having a plurality of second plates; activating a surface of the first wafer and a surface of the second wafer, and directly bonding the first wafer and the second wafer in a way to accommodate the piezoelectric vibrating piece in the first plate and the second plate; and performing a first inspection to inspect a bonding status after the bonding, wherein the first wafer or the second wafer is colored.

According to the tenth aspect of the disclosure, a manufacturing method of a piezoelectric device is provided, the step includes: preparing a plurality of piezoelectric vibrating pieces that vibrates by applying a voltage; preparing a first wafer that is formed of glass and having a plurality of first plates, and a second wafer that is formed of glass and having a plurality of second plates; bonding the first wafer and the second wafer using an adhesive agent in a way to accommodate the piezoelectric vibrating piece in the first plate and the second plate; and performing a first inspection to inspect a bonding status of the adhesive agent after the bonding, wherein one of the first wafer, the second wafer, and the adhesive agent is colored.

According to the eleventh aspect of the disclosure, a manufacturing method of a piezoelectric device is provided, the manufacturing step includes: preparing a plurality of piezoelectric vibrating pieces that vibrates by applying a voltage; preparing a first wafer that is formed of glass and has a plurality of first plates, and a second wafer that is formed of crystal and has a plurality of second plates; bonding the first wafer and the second wafer with an adhesive agent that is colored in a way to accommodate the piezoelectric vibrating piece in the first plate and the second plate; and performing a first inspection to inspect a bonding status of the adhesive agent after the bonding.

According to the twelfth aspect of the disclosure, on the basis of the ninth to the eleventh aspects, the manufacturing method of the piezoelectric device further includes: cutting the bonded first and second wafers into a unit of one piezoelectric device by dicing after the first inspection; and performing a second inspection to inspect a bonding status of the adhesive agent in each piezoelectric device after the cutting.

According to the thirteenth aspect of the disclosure, a manufacturing method of a piezoelectric device, including the steps of: preparing a piezoelectric wafer that includes a plurality of piezoelectric vibrating pieces, which respectively includes a piezoelectric vibrating portion that vibrates by applying a voltage and a frame body that surrounds the piezoelectric vibrating portion; preparing a first wafer that is formed of glass and having a plurality of first plates, and a second wafer that is formed of glass and having a plurality of second plates; performing a first bonding to bond the first wafer and the piezoelectric wafer with an adhesive agent; performing a first inspection to inspect a bonding status of the adhesive agent; performing a second bonding to bond the piezoelectric wafer and the second wafer with the adhesive agent; and performing a third inspection to inspect a bonding status of the adhesive agent after the second bonding, is provided, wherein one of the first wafer and the adhesive agent is colored.

According to the fourteenth aspect of the disclosure, a manufacturing method of a piezoelectric device is provided, including the steps of: preparing a piezoelectric wafer that includes a plurality of piezoelectric vibrating pieces, which respectively includes a piezoelectric vibrating portion that vibrates by applying a voltage and a frame body that surrounds the piezoelectric vibrating portion; preparing a first wafer that is formed of crystal and having a plurality of first plates and a second wafer that is formed of crystal and having a plurality of second plates; performing a first bonding to bond the first wafer and the piezoelectric wafer with an adhesive agent that is colored; performing a first inspection to inspect a bonding status of the adhesive agent after the first bonding; performing a second bonding to bond the piezoelectric wafer and the second wafer with the adhesive agent; and performing a third inspection to inspect a bonding status of the adhesive agent after the second bonding, is provided, wherein the adhesive agent is colored.

According to the fifteenth aspect of the disclosure, on the basis of the eleventh or the twelfth aspect, the manufacturing method of the piezoelectric device further includes: cutting the bonded first wafer, piezoelectric wafer, and second wafer into a unit of one piezoelectric device by dicing after the third inspection; and performing a second inspection to inspect a bonding status of the adhesive agent of each piezoelectric device after the cutting.

According to the sixteenth aspect of the disclosure, on the basis of the ninth to the fifteenth aspects, in the manufacturing method of the piezoelectric device, a color for coloring absorbs over 50% of each wavelength of an incident visible light.

Effects of the Invention

According to the invention, a piezoelectric device, in which the bonding status of the adhesive agent can be confirmed by coloring one of a lid, a base, and the adhesive agent, and the manufacturing method of the piezoelectric device can be provided.

BRIEF DESCRIPTION OF THE DRAWINGS

FIG. 5A is a cross-sectional view of a bonded wafer W130a.

FIG. 5B is an enlarged plan view of the bonded wafer W130a.

FIG. 5C is a cross-sectional view of a part of the bonded wafer W130a, which clips a foreign matter 170.

FIG. 5D is an enlarged plan view of the bonded wafer W130a.

FIG. 6A is a cross-sectional view of a bonded wafer W130b.

FIG. 6B is an enlarged plan view of the bonded wafer W130b.

FIG. 6C is a cross-sectional view of a part of the bonded wafer W130b, which clips the foreign matter 170.

FIG. 6D is an enlarged plan view of the bonded wafer W130b.

FIG. 7A is a cross-sectional view of a piezoelectric device 100a.

FIG. 14A is a cross-sectional view of the piezoelectric wafer W230 and the first wafer W300 that are bonded by the colored adhesive agent 150.

FIG. 14B is a cross-sectional view of the piezoelectric wafer W230 and the colored first wafer W300 that are bonded by the adhesive agent 150.

FIG. 15A is a cross-sectional view of a bonded wafer W500 that is formed by bonding the piezoelectric wafer W230 and the second wafer W400 with the colored adhesive agent 150.

FIG. 15B is a cross-sectional view of the bonded wafer W500 that is formed by bonding the piezoelectric wafer W230 and the colored second wafer W400 with the adhesive agent 150.

FIG. 16A is a cross-sectional view of the piezoelectric device 200a, in which the adhesive agent 150 is colored.

FIG. 16B is a cross-sectional view of the piezoelectric device 200b, in which the base 220 is colored.

DESCRIPTION OF THE EMBODIMENTS

Exemplary embodiments of the invention are described below with reference to the accompanying drawings. The scope of the invention, however, should not be limited by the descriptions of these embodiments unless otherwise specified.
(First Embodiment)
<Structure of the Piezoelectric Device 100>

Figure 1A:
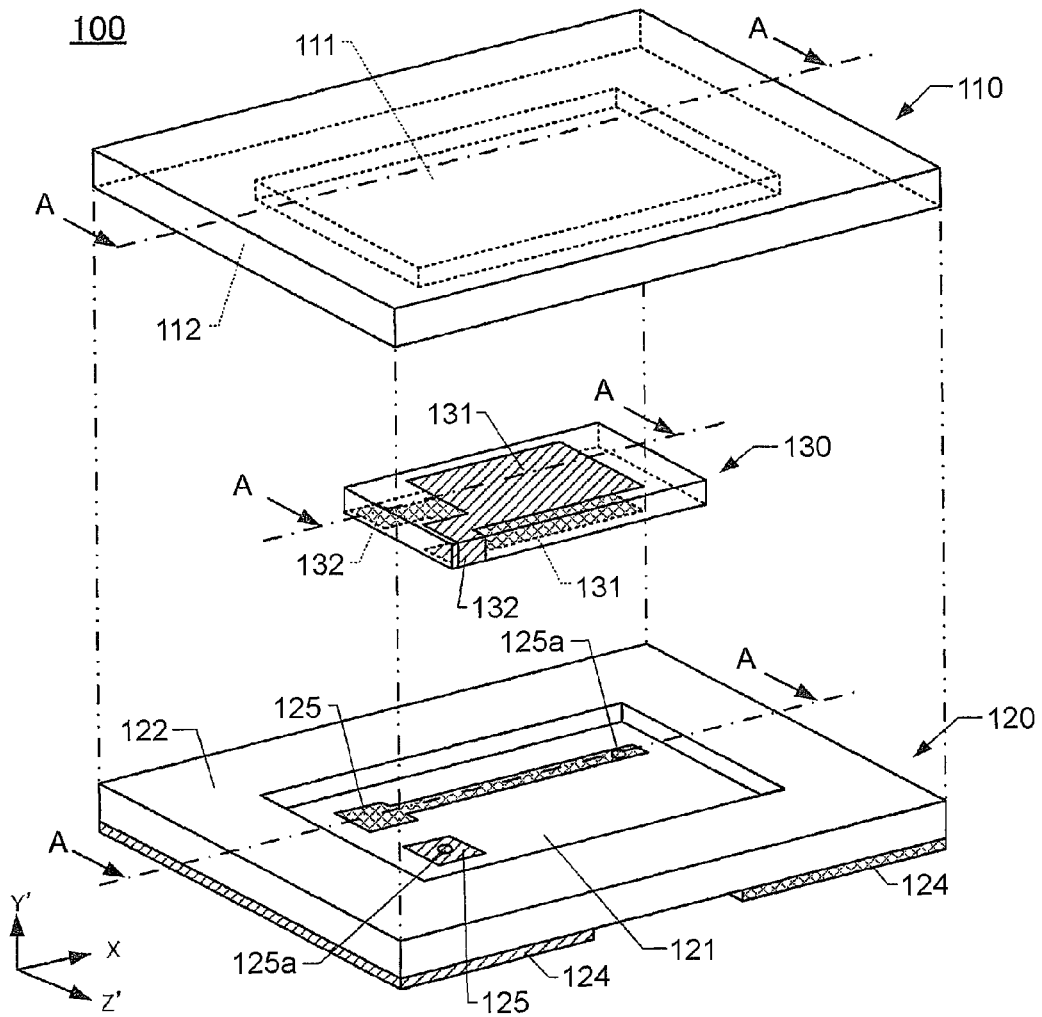
FIG. 1A is an exploded perspective view of a piezoelectric device 100.

FIG. 1A is an exploded perspective view of a piezoelectric device 100. The piezoelectric device 100 mainly includes a piezoelectric vibrating piece 130, a first plate 110, and a second plate 120. In the piezoelectric device 100, the first plate 110 is a lid and the second plate 120 is a base. In the piezoelectric device 100, an insulating material that is not electrically conductive, such as crystal, glass, and etc., is used as a material of the first plate 110 and the second plate 120. In addition, an AT-cut crystal vibrating piece is used as the piezoelectric vibrating piece 130, for example. Relative to the Y-axis of crystal axis (XYZ), a principal surface (YZ plane) of the AT-cut crystal vibrating piece is inclined by 35° 15' from the Z-axis toward the Y-axis direction with the X-axis as the center. In the following descriptions, the axis directions of the AT-cut crystal vibrating piece serve as the bases, and the inclined new axes are respectively defined as a Y'-axis and a Z'-axis. That is to say, in the piezoelectric device 100, a longitudinal direction of the piezoelectric device 100 is described as an X-axis direction, a height direction thereof is described as a Y'-axis direction, and a direction perpendicular to the X-axis direction and the Y'-axis direction is described as a Z'-axis direction.

In the piezoelectric device 100, the piezoelectric vibrating piece 130 is placed on the +Y'-axis surface of the second plate 120. Moreover, the first plate 110 is bonded to the second plate 120 on the +Y'-axis side in a way to seal the piezoelectric vibrating piece 130, so as to form the piezoelectric device 100.

Excitation electrodes 131 are disposed on the principal surfaces of the piezoelectric vibrating piece 130 on the +Y'-axis side and the −Y'-axis side. Moreover, extraction electrodes 132 are extended to be formed from each excitation electrode 131 in the −X-axis direction. The extraction electrode 132 connected to the excitation electrode 131 on the −Y'-axis side is extended to an end of the −X-axis side and the −Z'-axis side on a surface of the −Y'-axis side. Further, the extraction electrode 132 connected with the excitation electrode 131 formed on the +Y'-axis side is extended drawn to an end of the −X-axis side and the +Z'-axis side on the surface of the −Y'-axis side. The electrodes, e.g. excitation electrodes 131 and extraction electrodes 132, disposed on the piezoelectric vibrating piece 130 are formed by forming a foundation layer of chromium (Cr) on the piezoelectric vibrating piece 130 and forming an overlaying layer of gold (Au), for example.

A concave 111 is formed on a surface of the first plate 110 on the −Y'-axis side. In addition, a bonding surface 112 is formed surrounding the concave 111. The first plate 110 is bonded to the second plate 120 at the bonding surface 112.

A concave 121 is formed on a surface of the second plate 120 on the +Y'-axis side. In addition, a bonding surface 122 is formed surrounding the concave 121. A pair of connection electrodes 125 is disposed in the concave 121 for electrically connecting to the extraction electrodes 132 of the piezoelectric vibrating piece 130. A pair of mounting terminals 124 is formed on a surface of the second plate 120 on the −Y'-axis side. The pair of connection electrodes 125 is electrically connected with the pair of mounting terminals 124 via a through electrode 125a (refer to FIG. 1B) that passes through the second plate 120.

Figure 1B:
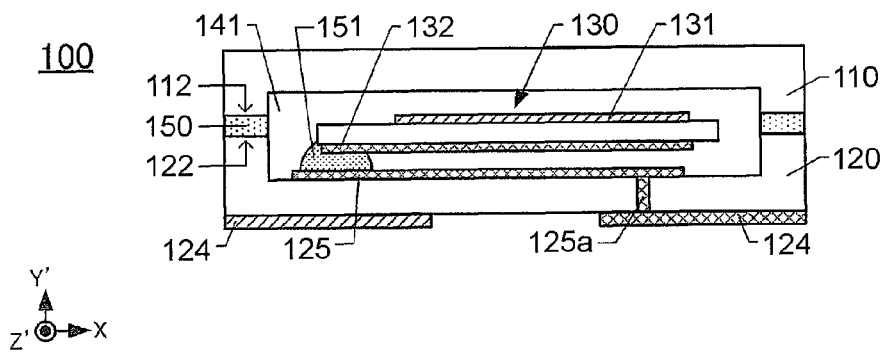
FIG. 1B is a cross-sectional view along Line A-A of FIG. 1A.

FIG. 1B is a cross-sectional view along the line A-A in FIG. 1A. The bonding surface 112 of the first plate 110 and the bonding surface 122 of the second plate 120 are bonded to each other using an adhesive agent 150. By bonding the first plate 110 and the second plate 120, a sealed cavity 141 is formed inside the piezoelectric device 100, and the piezoelectric vibrating piece 130 is disposed in the cavity 141. The extraction electrodes 132 of the piezoelectric vibrating piece 130 are electrically connected to the connection electrodes 125 through an electrically-conductive adhesive agent 151. Furthermore, the connection electrodes 125 are electrically connected to the mounting terminals 124 via the through electrode 125a that passes through the second plate 120. In other words, the excitation electrodes 131 of the piezoelectric vibrating piece 130 and the mounting terminals 124 are electrically connected, and the piezoelectric vibrating piece 130 vibrates by applying a voltage between the two mounting terminals 124.

In case that the first plate 110 and the second plate 120 of the piezoelectric device 100 are formed by using glass as a base material, one of the first plate 110, the second plate 120, and the adhesive agent 150 is colored. In case that the first plate 110 and the second plate 120 are formed by using crystal as the base material, the adhesive agent 150 is colored.

By coloring one of the first plate 110, the second plate 120, and the adhesive agent 150 of the piezoelectric device 100, an adhesion condition of the adhesive agent 150 can be easily observed. For this reason, one of the first plate 110, the second plate 120, and the adhesive agent 150 are preferably colored with a color that can enhance the contrast between a defective bonding part and a surrounding part thereof for easily recognizing the defective bonding part when defective bonding of the adhesive agent 150 occurs in the piezoelectric device 100. Such color is, for example, a dark color, such as black or brown. More specifically, such color absorbs over 50% wavelength of an incident visible light. With such color, scattering or reflection of light caused by the defective bonding of the adhesive agent 150 can be easily detected.

<Manufacturing Method of the Piezoelectric Device 100>

A manufacturing method of the piezoelectric device 100, in which the first plate 110 and the second plate 120 are bonded by the adhesive agent 150, is described with reference to FIGS. 2 to 7.

Figure 2:
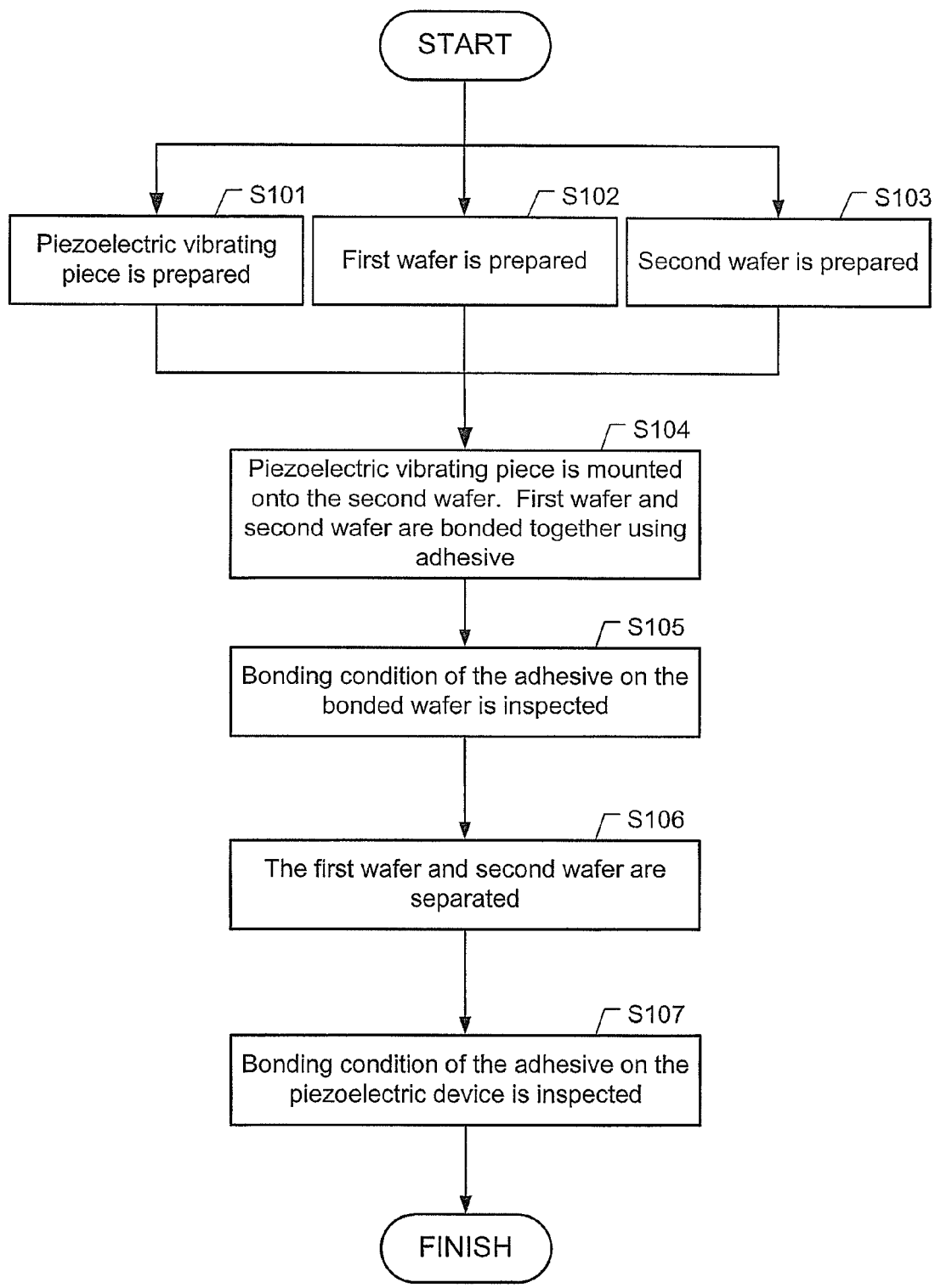
FIG. 2 is a flowchart illustrating a manufacturing method of the piezoelectric device 100.

FIG. 2 is a flowchart illustrating a manufacturing method of the piezoelectric device 100. First, in Step S101, a plurality of piezoelectric vibrating pieces 130 is prepared. As shown in FIG. 1A, excitation electrodes 131 and extraction electrodes 132 are formed on each piezoelectric vibrating piece 130.

In Step S102, a first wafer W110 is prepared. A plurality of the first plates 110 is formed on the first wafer W110. The first wafer W110 is, for example, formed of crystal or glass, etc. The first wafer W110 is described with reference to FIG. 3.

Figure 3:
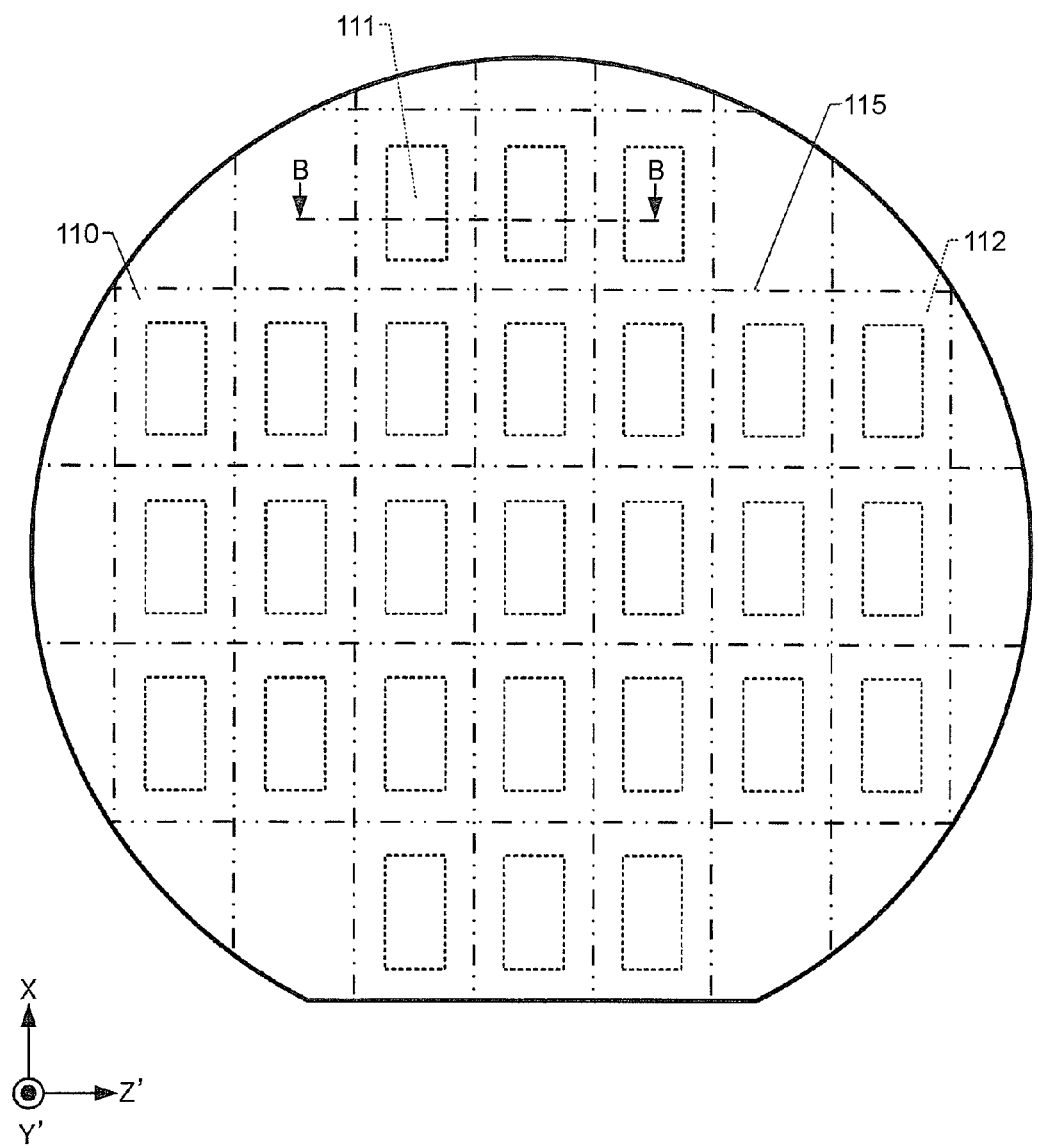
FIG. 3 is a plan view of a first wafer W110.

FIG. 3 is a plan view of the first wafer W110. The plurality of first plates 110 is formed on the first wafer W110. In FIG. 3, boundary lines between adjacent first plates 110 are indicated by two-dot chain lines. The two-dot chain lines are scribe lines 115 for cutting the wafer in Step S106 of FIG. 2, which will be described hereinafter. A concave 111 is formed on a surface of each of the first plates 110 on the −Y'-axis side. A bonding surface 112, to be bonded with a second wafer W120 (see FIG. 4), is formed around the concave 111.

In Step S103, a second wafer W120 is prepared. A plurality of second plates 120 is formed on the second wafer W120. The second wafer W120 is, for example, formed of crystal or glass, etc. The second wafer W120 is described with reference to FIG. 4.

Figure 4:
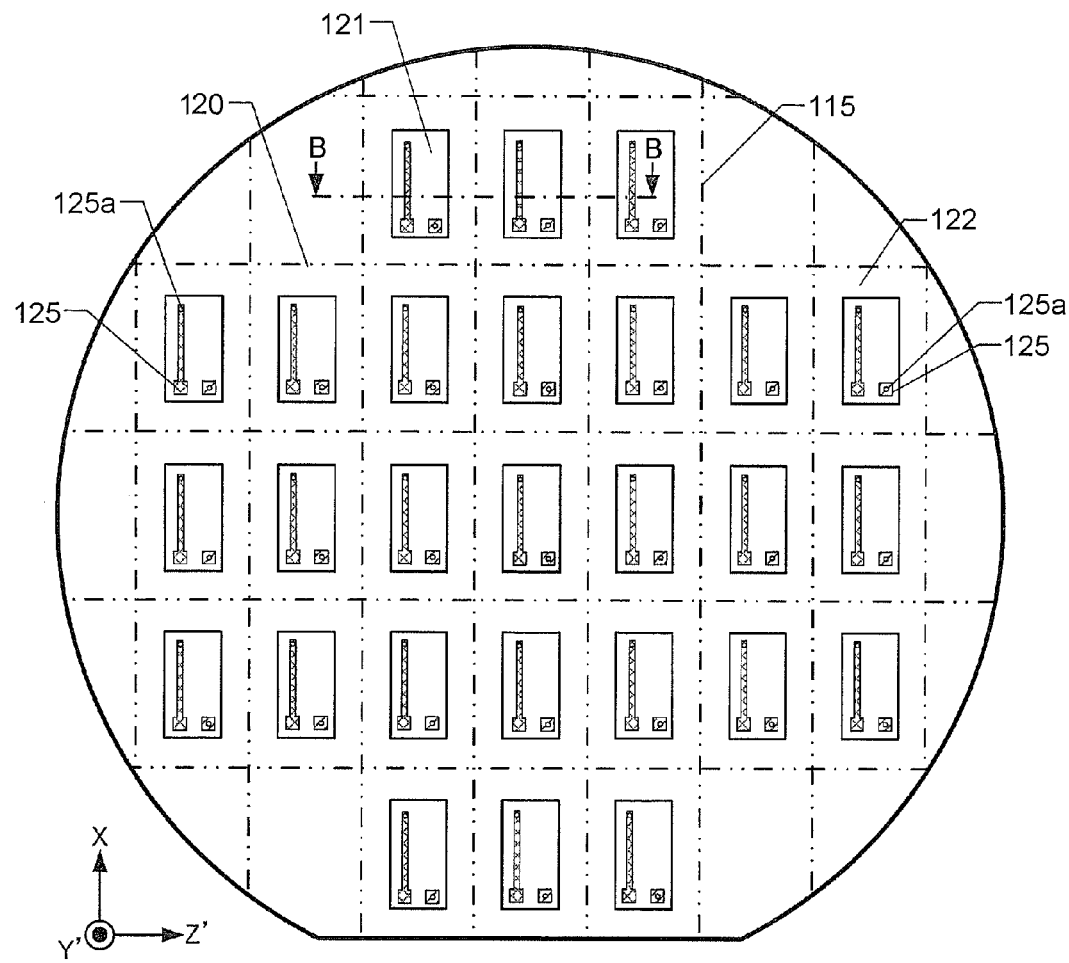
FIG. 4 is a plan view of a second wafer W120.

FIG. 4 is a plan view of the second wafer W120. The plurality of second plates 120 is formed on the second wafer W120. A concave 121 is formed on a surface of each second plates 120 on the +Y'-axis side, and the connection electrodes 125 and the through electrodes 125a are disposed in the concave 121. A bonding surface 122 is formed surrounding the concave 121. Moreover, the mounting terminals 124 (see FIG. 1A) are formed on a surface of the second wafer W120 on the −Y'-axis side. In FIG. 4, boundary lines between adjacent second plates 120 are indicated by two-dot chain lines. The two-dot chain lines are scribe lines 115 for cutting the wafer in Step S106 of FIG. 2, which will be described hereafter.

Aforementioned Steps S101-S103 can also be performed regardless of the sequence. In addition, in case that the first plate 110 and the second plate 120 are formed by using glass as the base material, one of the first wafer W110 or the second wafer W120 can be colored. The coloring of glass can be performed by mixing a coloring agent into the glass that is used as the base material of the first wafer W110 or the second wafer W120. Moreover, the coloring of the first wafer W110 or the second wafer W120 can also be performed by printing a colored and paste-like coloring agent onto a surface of the formed wafer on the +Y'-axis side or the −Y'-axis side by means of screen printing. Furthermore, the first wafer 110 or the second wafer 120 can also be prepared by applying a colored glass that can be purchased commercially.

In Step S104, the piezoelectric vibrating piece 130 is disposed on the second wafer W120, and the first wafer W110 and the second wafer W120 are bonded to each other using the adhesive agent 150. The piezoelectric vibrating pieces 130 are respectively disposed in the plurality of concaves 121 (see FIG. 4) formed on the second wafer W120. In addition, the first wafer W110 and the second wafer W120 are bonded by bonding the bonding surface 112 of the first wafer W110 and the bonding surface 122 of the second wafer W120 to each other with the adhesive agent 150. A wafer, obtained by bonding the first wafer W110 and the second wafer W120, is described as a bonded wafer W130 in the following paragraphs.

Low-melting-point glass can be used as the adhesive agent 150, for example. The low-melting-point glass, for example, melts at a temperature between 350° C.-410° C., which is lower than ordinary glasses. The low-melting-point glass is colored with different color than the first wafer W110 and the second wafer W120. The coloring of low-melting-point glass can be performed by mixing a coloring agent into the low-melting-point glass while preparing a paste of the low-melting-point glass. When the adhesive agent 150 is colored, a resin adhesive agent, such as polyimide, can be used, wherein the resin adhesive agent can be colored by mixing with a coloring agent. Moreover, the first wafer 110 or the second wafer 120 can also be prepared by employing a commercially available colored low-melting-point glass or colored resin adhesive agent.

In Step S105, bonding status of the adhesive agent 150 on the bonded wafer W130 is inspected. An inspection of the bonding status of the adhesive agent 150 in a bonded wafer W130a, in which the adhesive agent 150 is colored, is described with reference to FIGS. 5A to 5D. Further, a bonded wafer W130b, in which the second wafer W120 is colored, is described with references to FIGS. 6A to 6D.

<Inspection of Bonding Status of Bonded Wafer W130a>

FIG. 5A illustrates a cross-sectional view of the bonded wafer W130a. FIG. 5A is a cross-sectional view of the bonded wafer W130a in FIGS. 3 and 4 along the line B-B, in which the adhesive agent 150 is colored. The inspection of the bonding status of the adhesive agent 150 can be carried out visually or using an imaging element 160 to observe the adhesive agent 150 from the +Y'-axis side of the bonded wafer W130a. The inspection is preferably performed by irradiating light from the +Y'-axis side. In addition, when imaging element 160 is used to observe, a focal point is focused on the bonding surface. FIG. 5A illustrates a situation that the imaging element 160 is used to observe the adhesive agent 150.

FIG. 5B is an enlarged plan view of the bonded wafer W130a. FIG. 5B illustrates two adjacent piezoelectric devices 100 formed on the bonded wafer W130a. Because the adhesive agent 150 on the bonded wafer W130a in FIG. 5B is colored, ratio of each wavelength of a visible light that is incident from the −Y'-axis side to the +Y'-axis side is respectively reduced by more than 50% at the area where the adhesive agent 150 is formed, when the bonded wafer W130a is observed from the +Y'-axis side. Since the adhesive agent 150 is not formed on an area where the cavity 141 is formed, the light passes through the area of the cavity and is observed from the +Y'-axis side when the bonded wafer W130a being observed. FIG. 5B further illustrates a bonding failure area 152 of the adhesive agent 150. The adhesive agent 150 is not formed in the bonding failure area 152; therefore the bonding failure area 152 is brighter than the area where the adhesive agent 150 is formed. Thus, the defective bonding area 152 can be easily observed.

FIG. 5C is a cross-sectional view of a part of the bonded wafer W130a, in which a foreign matter 170 is caught in between. In FIG. 5C, the foreign matter 170 is caught between the first wafer W110 and the second wafer W120. If the size of the foreign article 170 is larger than the thickness of the adhesive agent 150, the first wafer W110 and the second wafer W120 around the foreign matter 170 would become distorted, as shown in FIG. 5C.

FIG. 5D is an enlarged plan view of the bonded wafer W130a. FIG. 5D illustrates the bonded wafer W130a wherein the foreign matter 170 is caught between the first wafer W110 and the second wafer W120. If the foreign matter 170 is located at a position indicated by an arrow 170 in FIG. 5D for example, the first wafer W110 and the second wafer W120 around the foreign matter 170 are distorted, and interference fringes 153, etc., as shown in FIG. 5D, are observed. Moreover, in case that a defect 154, e.g. breach or peeling off, exists on the first wafer W110, the presence of the defect 154 can be detected as the defect 154 is illuminated.

<Inspection of Bonding Status of the Bonded Wafer W130b>

FIG. 6A illustrates a cross-sectional view of the bonded wafer W130b. FIG. 6A is a cross-sectional view of the bonded wafer W130b in FIGS. 3 and 4 along the line B-B, in which the second wafer W120 is colored. The inspection of the bonding status of the adhesive agent 150 can be carried out visually or using the imaging element 160 to observe the adhesive agent 150 from the +Y'-axis side of the bonded wafer W130b. The inspection is preferably performed by irradiating a light from the +Y'-axis side. FIG. 6A illustrates a situation that the imaging element 160 is used to observe the adhesive agent 150.

FIG. 6B is an enlarged plan view of the bonded wafer W130b. FIG. 6B illustrates two adjacent piezoelectric devices 100 formed on the bonded wafer W130b. Because the second wafer W120 on the bonded wafer W130b shown in FIG. 6B is colored, the bonded wafer W130b does not have an area in which the light is passed through from the −Y'-axis side when observing the bonded wafer W130b from the +Y'-axis side. In FIG. 6B, the defective bonding area 152 of the adhesive agent 150 is illustrated. The defective bonding area 152 shown in FIG. 6B is formed at the same position as the defective bonding area 152 shown in FIG. 5B and has the same shape. Referring to FIG. 6B, a surface of the adhesive agent 150 adjacent to the defective bonding area 152 reflects the light and illuminates, and thus the defective bonding area 152 can be easily observed.

FIG. 6C is a cross-sectional view of a part of the bonded wafer W130b, in which the foreign matter 170 is caught between. In FIG. 6C, the foreign matter 170 is caught between the first wafer W110 and the second wafer W120. If the size of the foreign matter 170 is larger than the thickness of the adhesive agent 150, the first wafer W110 and the second wafer W120 around the foreign matter 170 would be distorted as shown in FIG. 6C.

FIG. 6D is an enlarged plan view of the bonded wafer W130b. FIG. 6D illustrates the bonded wafer W130b wherein the foreign matter 170 is clasped between the first wafer W110 and the second wafer W120. If the foreign matter 170 is located at a position indicated by the arrow 170 in FIG. 6D for example, the first wafer W110 and the second wafer W120 around the foreign matter 170 are distorted, and the interference fringes 153, etc., as shown in FIG. 6D, are observed. Because the thickness of the adhesive agent 150 (refer to a thickness L150 in FIG. 6C) around the foreign matter 170 varies, such interference fringes 153 are formed by interference resulted from a light reflected at the +Y'-axis side of the adhesive agent 150 and a light reflected at the −Y'-axis side of the adhesive agent 150. In addition, in case that the defect 154, e.g. breach or peeling off, exists on a surface of the first wafer W110 or the second wafer W120 on +Y'-axis side, the existence of the defect 154 can be detected for the defect 154 is illuminated.

Referring back to FIG. 2, in Step S106, the bonded wafer W130 is cut by dicing. The cutting is performed along the scribe lines 115. By cutting the bonded wafer W130, individual piezoelectric devices 100 are manufactured.

In Step S107, the bonding status of the adhesive agent 150 of the piezoelectric device 100 is inspected. If the adhesive agent 150 of the piezoelectric device 100 is not properly bonded or the first plate 110 and the second plate 120 have a breach or are distorted, the defective area can be observed as shown in FIGS. 5A-5D or FIGS. 6A-6D. Then, with references to FIGS. 7A and 7B, a piezoelectric device 100a, wherein the adhesive agent 150 is colored, and a piezoelectric device 100b, wherein the second plate 120 is colored, is described.

Figure 7A:
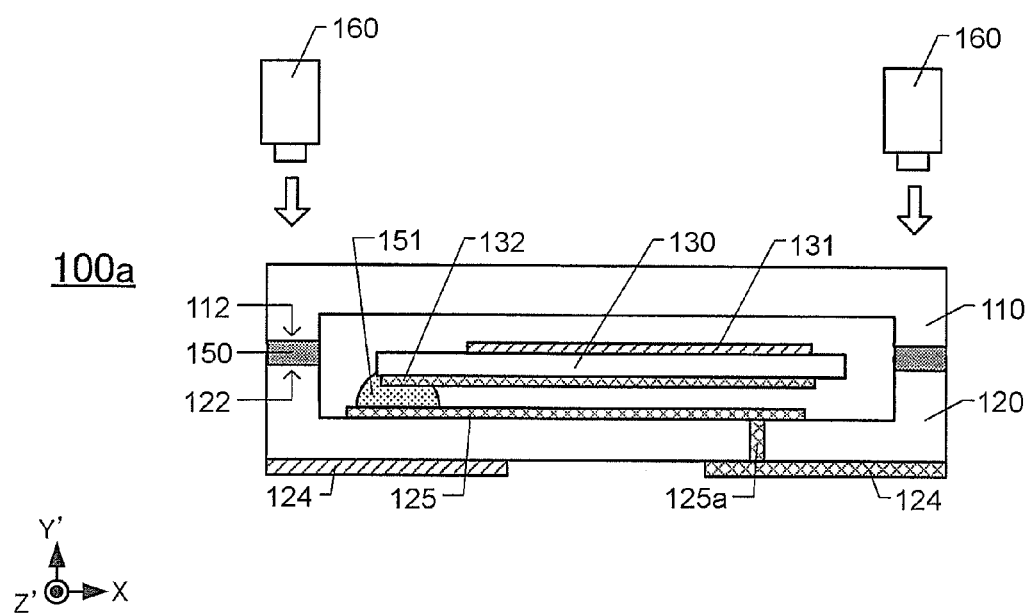

FIG. 7A is a cross-sectional view of the piezoelectric device 100a. This cross-sectional view includes the cross-section along the line A-A in FIG. 1A. In the piezoelectric device 100a, defects, such as breach or rupture, may be generated on the bonding surface 112 and the bonding surface 122 of the piezoelectric device 100a during the cutting process of Step S106. Similar to the bonding wafer illustrated in FIG. 5A, in Step S107, the bonding failure of the adhesive agent 150, and the breach and rupture, etc. of the first plate 110 can be inspected by observing the piezoelectric device 100a from the +Y'-axis side. The observation can be carried out visually or utilizing the imaging element 160.

Figure 7B:
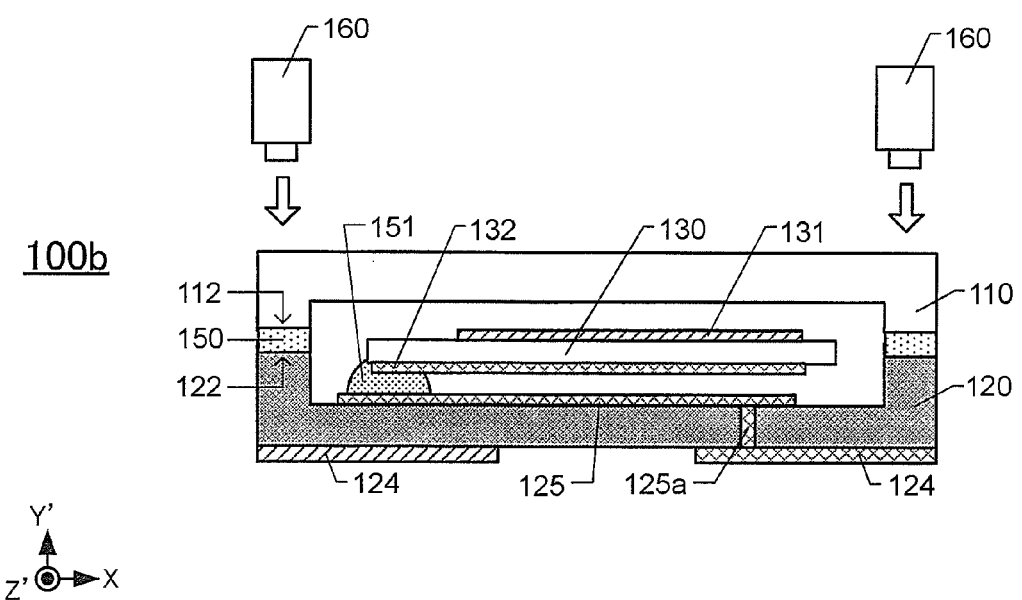
FIG. 7B is a cross-sectional view of a piezoelectric device 100b.

FIG. 7B is a cross-sectional view of the piezoelectric device 100b. The cross-sectional view of the piezoelectric device 100b in FIG. 1A is taken along the line A-A. In the piezoelectric device 100b, defects such as breach or rupture may be generated on the bonding surface 112 and the bonding surface 122 of the piezoelectric device 100b in the cutting process of Step S106. Similar to FIG. 6A, in Step S107, the bonding failure of the adhesive agent 150, and the breach and rupture, etc. of the first plate 110 and the second plate 120 can be inspected by observing the piezoelectric device 100b from the +Y'-axis side. The observation can be carried out visually or utilizing the imaging element 160.

The first plate 110 of the piezoelectric device 100 can be colored, and the piezoelectric device 100 can also be fabricated according to the flowchart of FIG. 2. In case that the first plate 110 is colored, the inspection from the +Y'-axis side cannot be performed; thus, the inspection is carried out by observing from the −Y'-axis side. When observing from the −Y'-axis side, an inspection area would be narrowed by the mounting terminals 124. For this reason, the mounting terminals 124 are preferably not formed in Step S103 of FIG. 2, and formed after the inspection in Step S105 is performed.

In the piezoelectric device 100, by coloring the adhesive agent 150, the first plate 110 or the second plate 120, the contrast in the adhesive agent 150 between the area with bonding defect and the area without bonding defect becomes large, and the bonding status of the adhesive agent 150 can be easily observed accordingly. Additionally, by forming the colored area on the adjacent area to be observed (e.g. the bonding surface 112 of the first plate 110, etc.), noise of the light to the area that is to be observed is suppressed. As a result, the area to be observed can be more clearly inspected. Furthermore, when using the imaging element 160 to perform the inspection, focal point of the imaging element 160 can be adjusted to the area to be observed, such as the bonding surfaces of the adhesive agent 150, to clearly inspect the area to be observed. In addition, since the piezoelectric device 100 itself is colored, the piezoelectric device 100 can be inspected at any time, e.g. during shipped or after being mounted onto a printed circuit board.

<Second Embodiment>

A piezoelectric device can also be formed as a three-layer piezoelectric device, which is formed by stacking a piezoelectric vibrating piece including a piezoelectric vibrating portion and a frame body, a first plate, and a second plate, wherein the frame body is held between the first plate and the second plate. A piezoelectric device 200, which is a three-layer piezoelectric device, is described in the following embodiment.

<Structure of the Piezoelectric Device 200>

Figure 8:
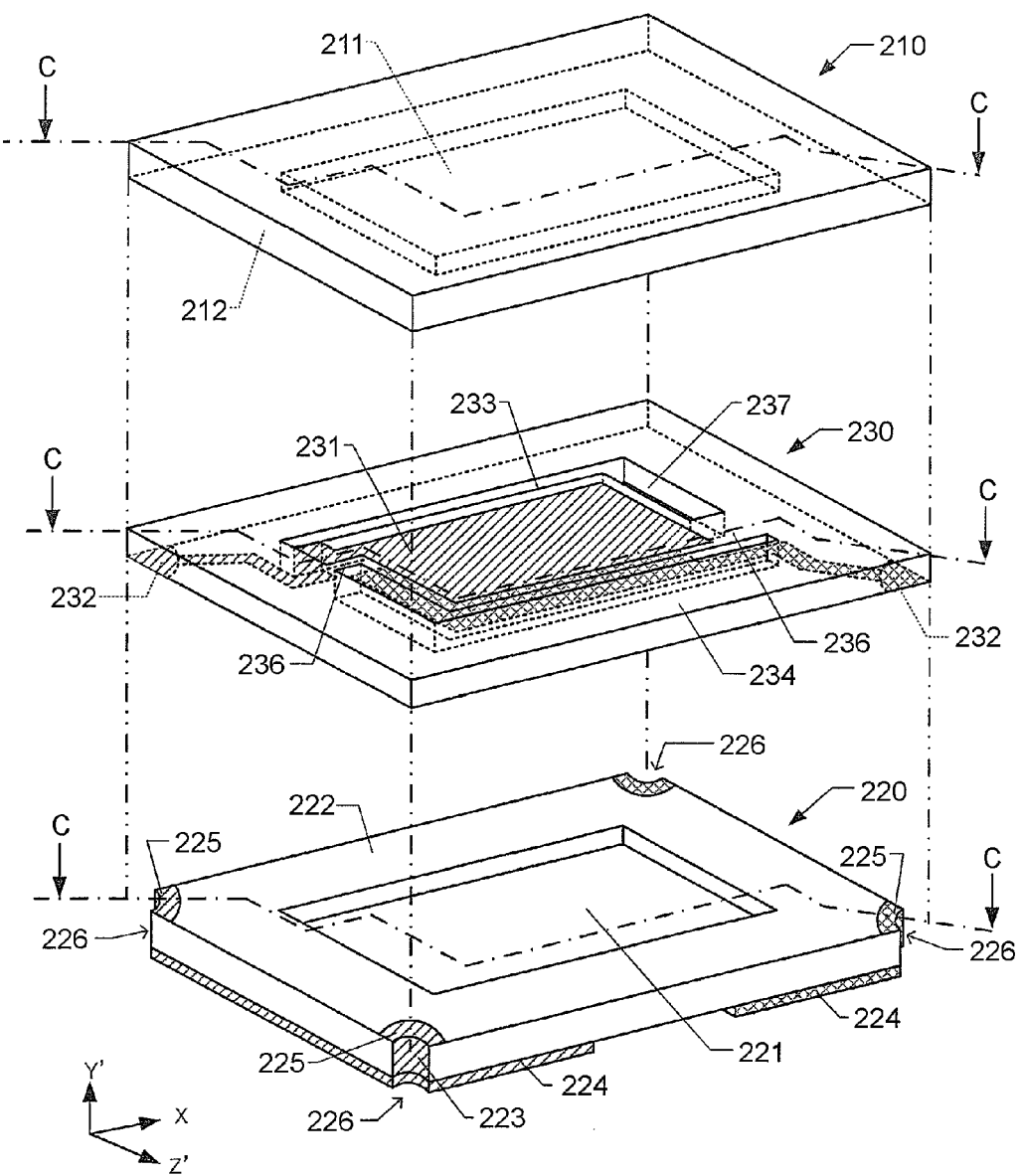
FIG. 8 is an exploded perspective view of a piezoelectric device 200.

FIG. 8 is an exploded perspective view of the piezoelectric device 200. The piezoelectric device 200 mainly includes a piezoelectric vibrating piece 230, a first plate and a second plate, wherein the piezoelectric vibrating piece 230 is sandwiched between the first plate and the second plate. The first plate and the second plate are respectively formed as a lid 210 and a base 220. An insulating material that is not electrically conductive, such as crystal, glass, and etc., is used as material for the lid 210 and the base 220. In addition, an AT-cut crystal vibrating piece is used as the piezoelectric vibrating piece 230, for example.

The piezoelectric vibrating piece 230 includes a piezoelectric vibrating portion 233 which vibrates by applying voltage, a frame body 234 surrounding the piezoelectric vibrating portion 233, and a connection portion 236 for connecting the piezoelectric vibrating portion 233 and the frame body 234. Moreover, a through hole 237 is formed between the piezoelectric vibrating portion 233 and the frame body 234 that passes through the piezoelectric vibrating piece 230 in the Y'-axis direction. A pair of excitation electrodes 231 is respectively formed on surfaces of the piezoelectric vibrating portion 233 on the +Y'-axis side and the –Y'-axis side. In addition, extraction electrodes 232 are respectively formed to connect with the excitation electrode 231 on the –Y'-axis side and extend to a corner of the frame body 234 on the +Z'-axis side and the +X-axis side via the connection portion 236, and to connect the excitation electrode 231 on the +Y'-axis side and extend to a corner of the frame body 234 on the –Z'-axis side and the –X-axis side via the connection portion 236.

A concave 211 is formed on a surface of the lid 210 on the –Y'-axis side, and a bonding surface 212 is formed surrounding the concave 211. The bonding surface 212 of the lid 210 is bonded to a surface of the frame body 234 of the piezoelectric vibrating piece 230 on the +Y'-axis side via the adhesive agent 150 (see FIG. 9).

A concave 221 is formed on a surface of the base 220 on the +Y'-axis side, and a bonding surface 222 is formed surrounding the concave 221. The bonding surface 222 of the base 220 is bonded to a surface of the frame body 234 of the piezoelectric vibrating piece 230 on the –Y'-axis side via the adhesive agent 150 (see FIG. 9). A pair of mounting terminals 224 is formed on a surface of the base 220 on the –Y'-axis side, and electrode pads 225 are formed on each corner on the +Y'-axis side. In addition, the castellations 226 are formed on each corner of lateral sides of the base 220, and a side electrode 223 is formed on each castellation 226. The mounting terminals 224 are electrically connected with the electrode pads 225 via the side electrodes 223 formed on the castellations 226.

Figure 9:
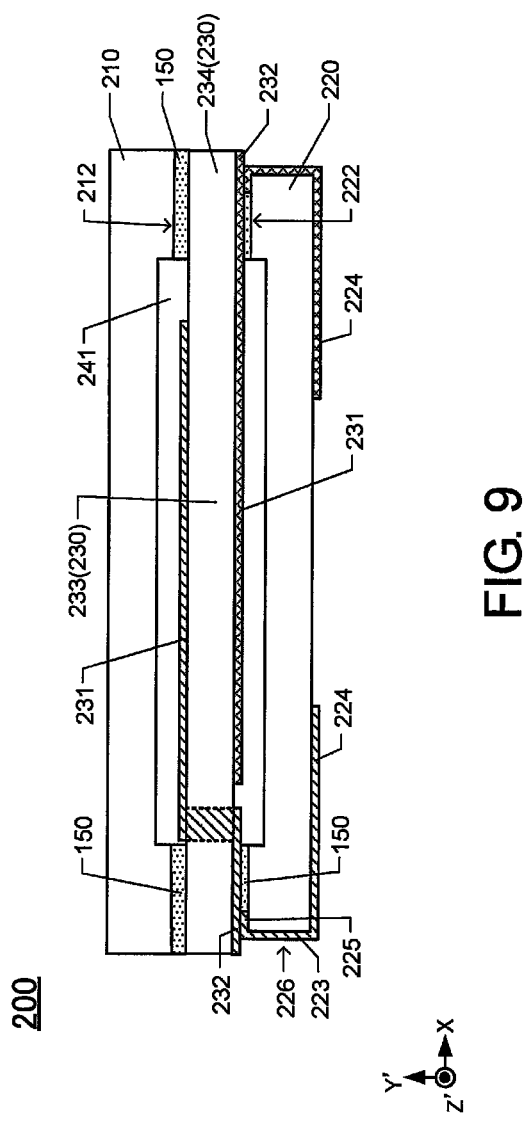
FIG. 9 is a cross-sectional view of the piezoelectric device 200.

FIG. 9 is a cross-sectional view of the piezoelectric device 200. FIG. 9 is also a cross-section along the line C-C in FIG. 8. In the piezoelectric device 200, the lid 210 is bonded to the surface of the frame body 234 of the piezoelectric vibrating piece 230 on the +Y'-axis side, and the base 220 is bonded to the surface of the frame body 234 of the piezoelectric vibrating piece 230 on the –Y'-axis side. The lid 210 and the base 220 are respectively bonded to the piezoelectric vibrating piece 230 using the adhesive agent 150. Moreover, a cavity 241 is constructed on the concave 211 of the lid 210 and the concave 221 of the base 220, and the piezoelectric vibrating portion 233 of the piezoelectric vibrating piece 230 is disposed on the cavity 241. Furthermore, the extraction electrodes 232 of the piezoelectric vibrating piece 230 are electrically connected with the electrode pads 225.

If the lid 210 and the base 220 of the piezoelectric device 200 are formed using crystal as a base material, the adhesive agent 150 is colored. However, if the lid 210 and the base 220 are formed by using glass as base material, one of the lid 210, the base 220, and the adhesive agent 150 is colored. In the following paragraphs, the piezoelectric device 200 having the colored adhesive agent 150 is referred to as a piezoelectric device 200a; the piezoelectric device 200 having the colored base 220 is referred to as a piezoelectric device 200b; and the piezoelectric device 200 having the colored lid 210 is referred to as a piezoelectric device 200c.

<Manufacturing Method of the Piezoelectric Device 200a or the Piezoelectric Device 200b>

Similar to the piezoelectric device 100, bonding status of the adhesive agent 150 is preferably inspected during the manufacture of the piezoelectric device 200. The following paragraphs describe a manufacturing method of the piezoelectric device 200, particularly the piezoelectric device 200a and the piezoelectric device 200b, with reference to FIG. 10.

Figure 10:
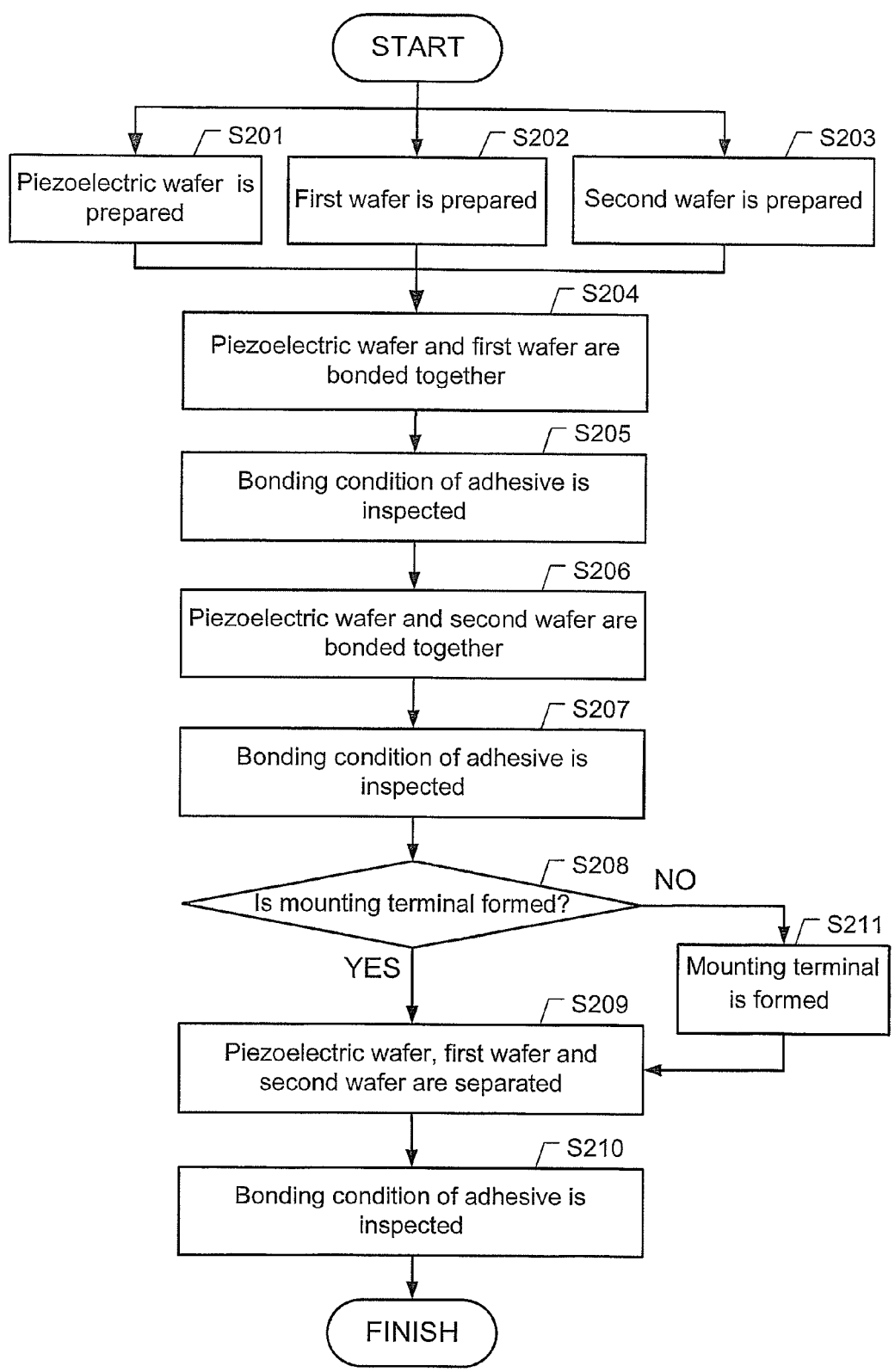
FIG. 10 is a flowchart showing a manufacturing method of the piezoelectric device 200.

FIG. 10 is a flowchart showing a manufacturing method of the piezoelectric device 200. In Step S201, a piezoelectric wafer W230 is prepared. A plurality of piezoelectric vibrating pieces 230 is formed on the piezoelectric wafer W230. The piezoelectric wafer W230 is formed by using a piezoelectric material, such as crystal, as the base material. The piezoelectric wafer W230 is described with reference to FIG. 11.

Figure 11:
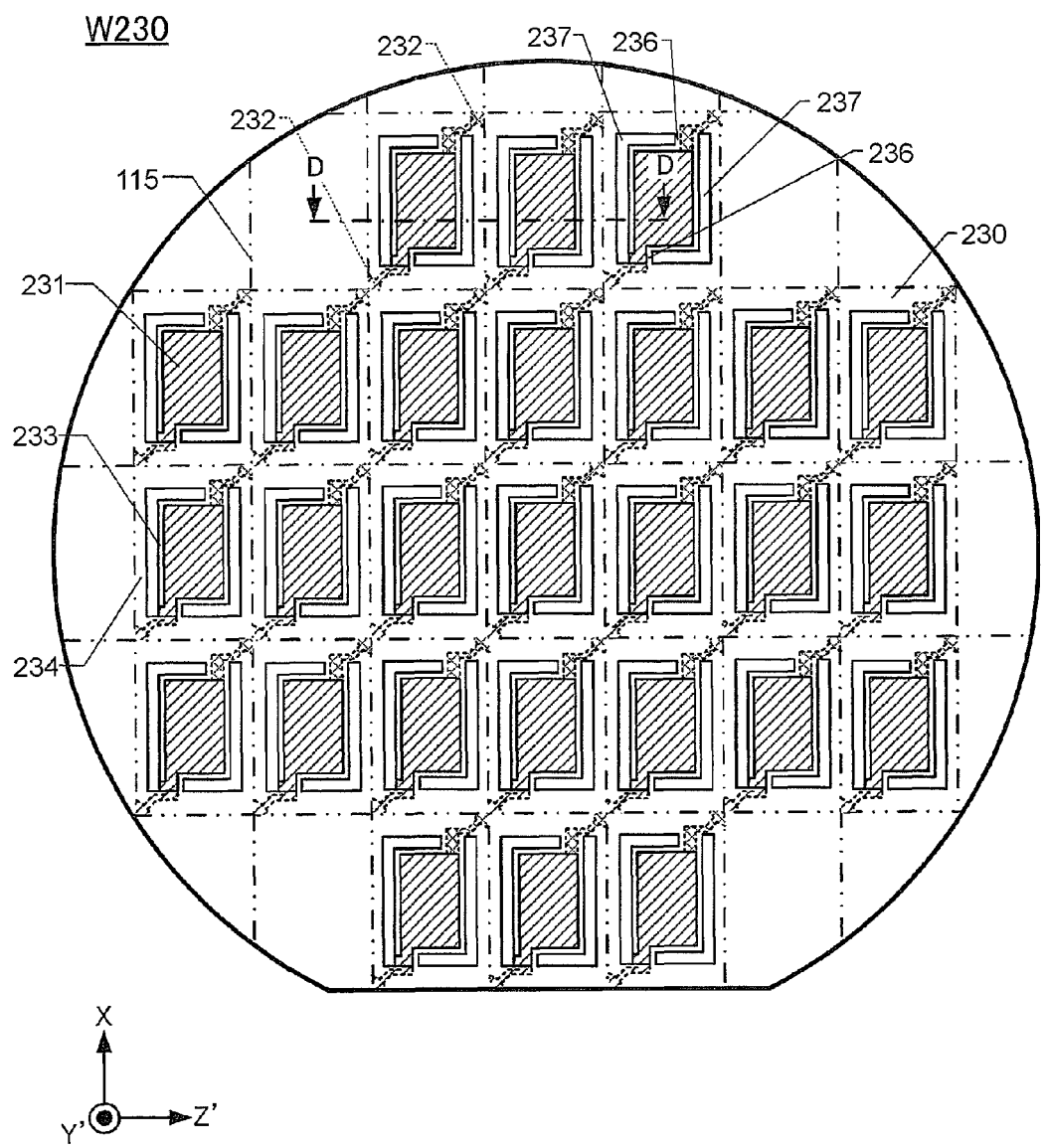
FIG. 11 is a plan view of a piezoelectric wafer W230.

FIG. 11 is a plan view of the piezoelectric wafer W230. The plurality of piezoelectric vibrating pieces 230 is formed on the piezoelectric wafer W230. In FIG. 11, scribe lines 115, by which the wafer is cut in the Step S208 of FIG. 10 described below, are indicated by two-dot chain lines, and one piezoelectric vibrating piece 230 is formed in each areas surrounded by the scribe lines. The piezoelectric vibrating portion 233, the frame body 234, and the connection portion 236 are formed simultaneously with formation of the through holes 237 on each piezoelectric vibrating piece 230 of the piezoelectric wafer W230. In addition, the excitation electrodes 231 are formed on the piezoelectric vibrating portion 233. The extraction electrodes 232, which are drawn from the excitation electrodes 231 via the connection portions 236, are formed on the frame body 234.

In Step S202, a first wafer W300 is prepared. A plurality of first plates is formed on the first wafer W300. The first plate can be the lid 210 or the base 220. In the following disclosure, the first plate is the base 220, and the first wafer W300 has a plurality of bases 220 formed thereon. The first wafer W300 is formed of crystal or glass, for example. The first wafer W300 is described below with reference to FIG. 12.

Figure 12:
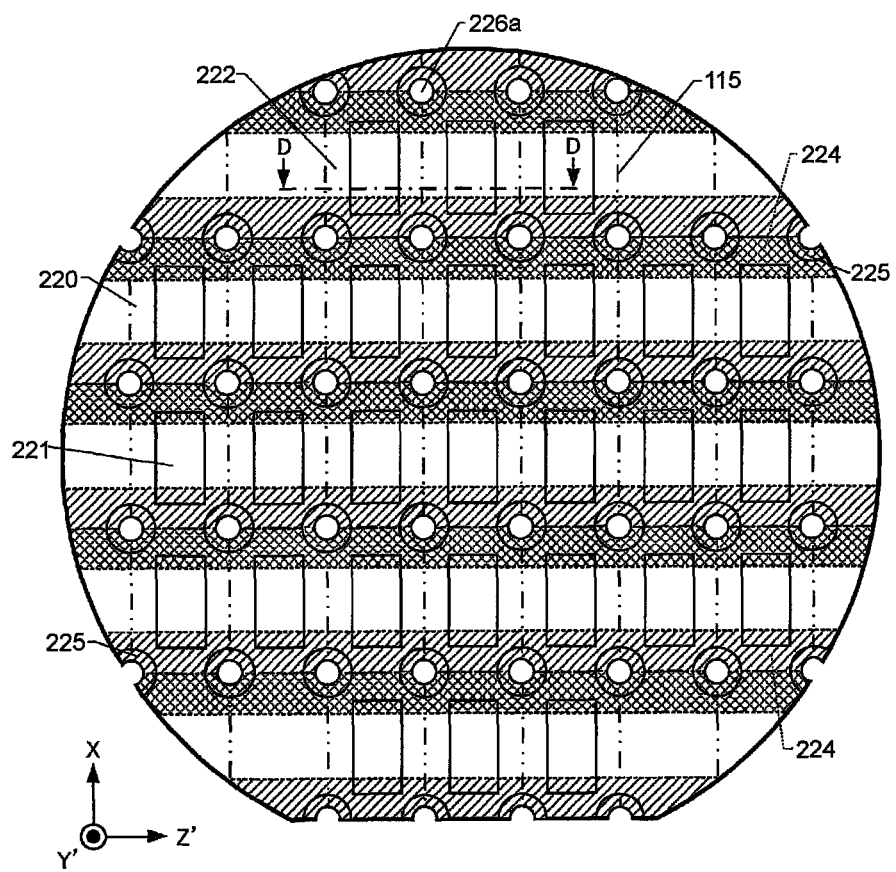
FIG. 12 is a plan view of a first wafer W300.

FIG. 12 is a plan view of the first wafer W300. The plurality of bases 220 is formed on the first wafer W300. In FIG. 12, scribe lines 115 are indicated by two-dot chain lines, and one base 220 is formed on each area surrounded by the scribe lines 115. The concave 221 is formed on the surface of each of the bases 220 on the +Y'-axis side, and the bonding surface 222 is formed surrounding the concave 221. In addition, on the intersections of scribe lines of the Z'-axis direction and the X-axis direction, through holes 226a, which serve as the castellations 226, are formed on the bases 220, and side electrodes 223 (see FIGS. 8 and 9) are formed on the castellations 226. The electrode pads 225 are formed surrounding the through holes 226a, and the mounting terminals 224 are formed on the surface of the base 220 on the −Y'-axis side.

In Step S203, a second wafer W400 is prepared. A plurality of second plates is formed on the second wafer W400. The second plate can be the lid 210 or the base 220. In the following description, the second plate is the lid 210, and the second wafer W400 has a plurality of lids 210 formed thereon. The second wafer W400 is formed of crystal or glass, for example. The second wafer W400 is described below with reference to FIG. 13.

Figure 13:
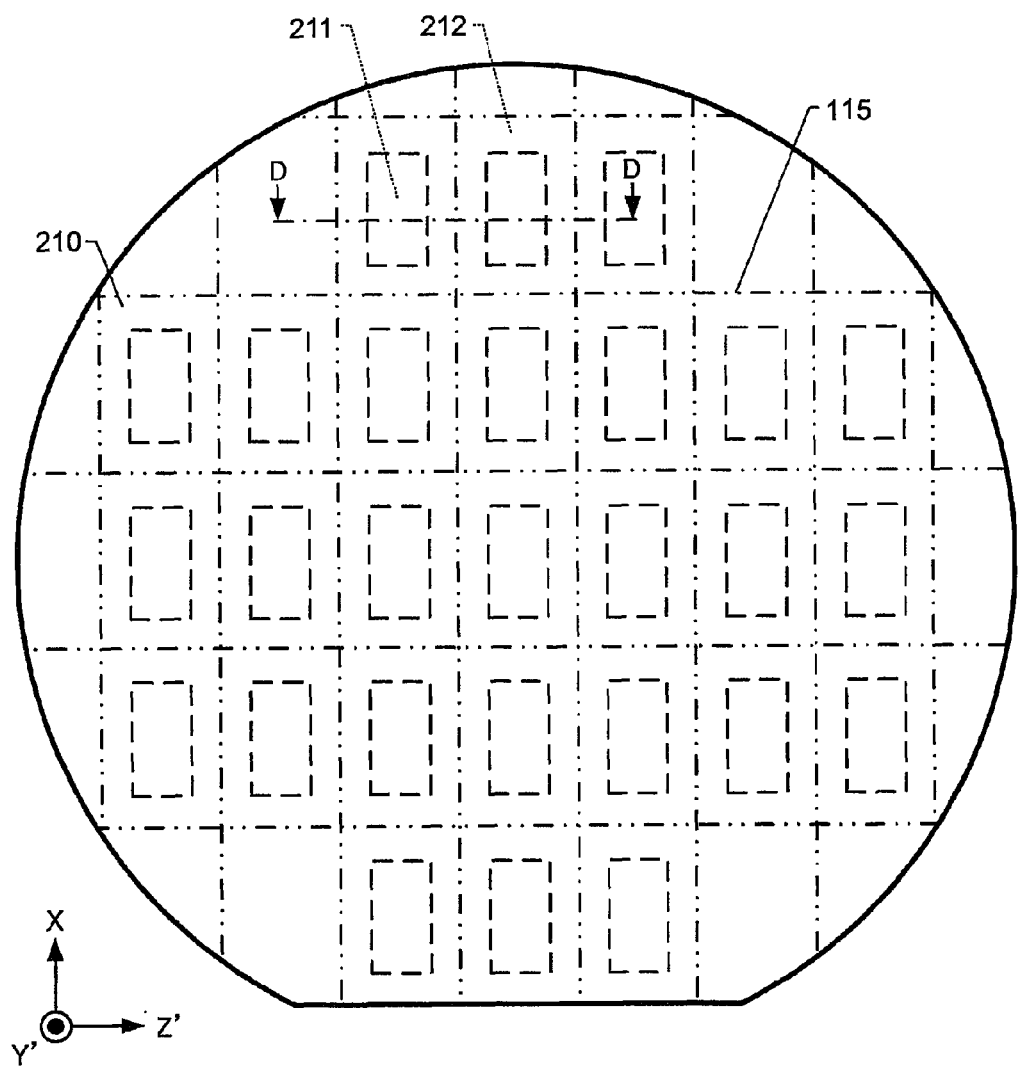
FIG. 13 is a plan view of a second wafer W400.

FIG. 13 is a plan view of the second wafer W400. The plurality of lids 210 is formed on the second wafer W400. In FIG. 13, the scribe lines 115 are indicated by two-dot chain lines, and one lid 210 is formed on each area surrounded by the scribe lines 115. The concave 211 is formed on the surface of each lid 210 on the −Y'-axis side, and the bonding surface 212 is formed surrounding the concave 211.

In Step S204, the piezoelectric wafer W230 and the first wafer W300 are bonded to each other using the adhesive agent 150. FIG. 14A illustrates a situation that the adhesive agent 150 is colored, and FIG. 14B illustrates a situation that the base 220 is colored.

FIG. 14A is a cross-sectional view of the piezoelectric wafer W230 and the first wafer W300 bonded together by the colored adhesive agent 150. The cross-sectional view of FIG. 14A includes the cross-sections of FIGS. 11 and 12 along the lines D-D. In FIG. 14A, the piezoelectric wafer W230 is bonded to the surface of the first wafer W300 on the +Y'-axis side using the adhesive agent 150.

FIG. 14B is a cross-sectional view of the piezoelectric wafer W230 and the colored first wafer W300 that are bonded by the adhesive agent 150. The cross-sectional view of FIG. 14B includes cross-sections of FIGS. 11 and 12 along the lines D-D. In FIG. 14B, the piezoelectric wafer W230 is bonded to the surface of the first wafer W300 on the +Y'-axis side by the adhesive agent 150.

In Step S205, the bonding status of the adhesive agent 150 is inspected. Because the piezoelectric vibrating piece 230 is formed by using a transparent material, such as crystal, as the base material, the bonding status of the adhesive agent 150 can be observed when the bonded wafer of the piezoelectric wafer W230 and the first wafer W300 is viewed from the +Y'-axis side. In FIG. 14A, the adhesive agent 150 is colored, and as described in FIG. 5, the status of the bonding surface between the adhesive agent 150 and the piezoelectric wafer W230 can be easily observed from the +Y'-axis side. Furthermore, even though in the situation of FIG. 14B that the first wafer W300 is colored, as described in FIG. 6, the status of the bonding surfaces between the adhesive agent 150 and the piezoelectric wafer W230 and between the adhesive agent 150 and the first wafer W300 can be easily observed from the +Y'-axis side. These observations can be carried out visually or using the imaging element 160. Moreover, in Step S205, the observation can also be performed from the −Y'-axis side of FIGS. 14A and 14B by turning over the wafer.

In Step S206, the piezoelectric wafer W230 and the second wafer W400 are bonded to each other using the adhesive agent 150. FIG. 15A illustrates a situation that the adhesive agent 150 is colored, and FIG. 15B illustrates a situation that the base 220 is colored.

FIG. 15A is a cross-sectional view of a bonded wafer W500 that is formed by bonding the piezoelectric wafer W230 and the second wafer W400 with the colored adhesive agent 150. The cross-sectional view of FIG. 15A includes cross-sections of FIGS. 11-13 along the lines D-D. In FIG. 15A, the second wafer W400 is bonded to the surface of the piezoelectric wafer W230 on the +Y'-axis side by the adhesive agent 150 after the status of FIG. 14A. As a result, the three wafers, i.e. the first wafer W300, the second wafer W400, and the piezoelectric wafer W230, are stacked together and form the bonded wafer W500, and a plurality of piezoelectric devices 200a are formed on the bonded wafer W500.

FIG. 15B is a cross-sectional view of the bonded wafer W500 formed by bonding the piezoelectric wafer W230 and the colored first wafer W4300 with the adhesive agent 150. The cross-sectional view of FIG. 15B includes cross-sections of FIGS. 11-13 along the lines D-D. In FIG. 15B, the second wafer W400 is bonded to the surface of the piezoelectric wafer W230 on the +Y'-axis side by the adhesive agent 150. As a result, the three wafers, i.e. the first wafer W300, the second wafer W400, and the piezoelectric wafer W230, are stacked together and the bonded wafer W500 are formed, and a plurality of piezoelectric devices 200b is formed on the bonded wafer W500.

In Step S207, bonding status of the adhesive agent 150 is inspected. Because the lid 210 is formed by using a transparent material as the base material, such as crystal or glass, the bonding status of the adhesive agent 150 can be observed when the bonded wafer W500 of the first wafer W300, the second wafer W400, and the piezoelectric wafer W230 is viewed from the +Y'-axis side. In FIG. 15A, the adhesive agent 150 is colored, and thus the status of the bonding surface between the adhesive agent 150 and the second wafer W400 can be observed from the +Y'-axis side. Furthermore, in the situation of FIG. 15B that the first wafer W300 is colored, the bonding status of the adhesive agent 150 between the piezoelectric wafer W230 and the first wafer W300 and between the piezoelectric wafer W230 and the second wafer W400 can be observed from +Y'-axis side. These observations can be carried out visually or using the imaging element 160.

In Step S208, the formation of the mounting terminals 224 is determined. If the mounting terminals 224 have been formed, Step S209 is carried out. If the mounting terminals 224 have not been formed, Step S211 is carried out instead. In FIGS. 15A and 15B, because the mounting terminals 224 have been formed in Step S202 (see FIG. 12), Step S209 is carried out. When proceeding to Step S211, a manufacturing method of a piezoelectric device 200c is explained hereinafter.

In Step S209, the bonded wafer W500 formed by bonding the piezoelectric wafer W230, the first wafer W300, and the second wafer W400 is separated. The cutting is performed by dicing along the scribe lines 115, so as to form individual piezoelectric devices 200.

In Step S210, the bonding status of the adhesive agent 150 in the piezoelectric device 200 is inspected. The piezoelectric device 200a, in which the adhesive agent 150 is colored, is described with reference to FIG. 16A, and the piezoelectric device 200b, in which the base 220 is colored, is described with reference to FIG. 16B.

FIG. 16A is a cross-sectional view of the piezoelectric device 200a, in which the adhesive agent 150 is colored. FIG. 16A shows the cross-sectional view including the cross-section of FIG. 8 along the line C-C. According to FIG. 16A, the bonding status of the adhesive agent 150 at the bonding surface between the lid 210 and the adhesive agent 150 can be inspected by observing the piezoelectric device 200a from the +Y'-axis side surface.

FIG. 16B is a cross-sectional view of the piezoelectric device 200b, in which the base 220 is colored. FIG. 16B shows the cross-section of FIG. 8 along the line C-C. According to FIG. 16(b), the bonding status at the bonding surfaces between the lid 210 and the adhesive agent 150 and between the base 220 and the adhesive agent 150 can be inspected by observing the piezoelectric device 200b from the +Y'-axis side surface.

<Manufacturing Method of the Piezoelectric Device 200c>

In the examples shown in FIGS. 14-16, the adhesive agent 150 or the base 220 is colored. However, the lid 210 of the piezoelectric device 200 can also be colored. A manufacturing method of a piezoelectric device 200c, in which the lid 210 is colored, is described with reference to the flowchart of FIG. 10.

In Step S201 to Step S203, the piezoelectric wafer W230, a first wafer W300c, and a second wafer W400c are prepared. In the piezoelectric device 200c, the first plate is used as the lid 210 and the second plate is used as the base 220. In other words, a plurality of lids 210 is formed on the first wafer W300c, and a plurality of bases 220 is formed on the second wafer W400c. Additionally, in Step S203, the mounting terminals 224 are not formed on the bases 220 that are formed on the second wafer W400c.

In Step S204, the piezoelectric wafer W230 and the first wafer W300c are bonded to each other by the adhesive agent 150. In Step S205, the bonding status of the adhesive agent 150 is inspected.

Figure 17A:
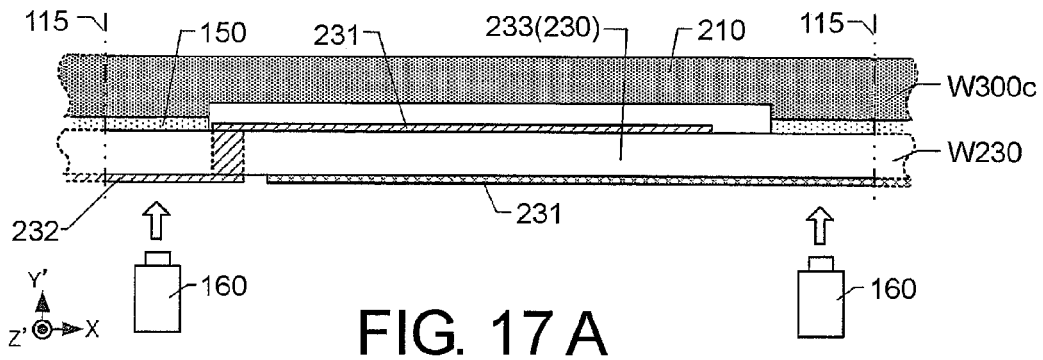
FIG. 17A is a cross-sectional view of the piezoelectric wafer W230 and the colored first wafer W300c that are bonded by the adhesive agent 150.

FIG. 17A is a cross-sectional view of the piezoelectric wafer W230 and the colored first wafer W300c that are bonded by the adhesive agent 150. In FIG. 17A, the first wafer W300c is bonded to the surface of the piezoelectric wafer W230 on the +Y'-axis side via the adhesive agent 150. Because the first wafer W300c is colored, the bonding status of the adhesive agent 150 can be inspected by observing from the -Y'-axis side. Similar to FIG. 6, by observing from the -Y'-axis side, the status of the bonding surfaces between the adhesive agent 150 and the piezoelectric wafer W230 and between the adhesive agent 150 and the first wafer W300c can be easily observed. These observations can be performed visually or using the imaging element 160.

In Step S206, the piezoelectric wafer W230 and the second wafer W400c are bonded to each other using the adhesive agent 150. In Step S207, the bonding status of the adhesive agent 150 is inspected.

Figure 17B:
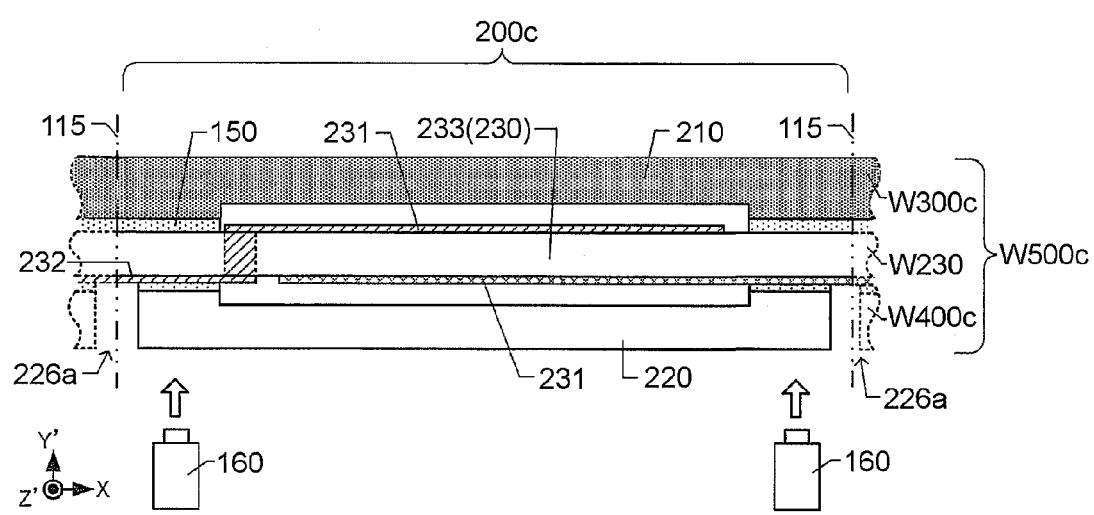
FIG. 17B is a cross-sectional view of a bonded wafer W500c, which is formed by bonding the piezoelectric wafer W230 and the colored second wafer W400c with the adhesive agent 150.

FIG. 17B is a cross-sectional view of a bonded wafer W500c, which is formed by bonding the piezoelectric wafer W230 and the colored second wafer W400c with the adhesive agent 150. In FIG. 17B, the second wafer W400c is bonded to the surface of the piezoelectric wafer W230 on the -Y'-axis side by the adhesive agent 150. As a result, the three wafers, i.e. the first wafer W300c, the second wafer W400c, and the piezoelectric wafer W230, are stacked together and form the bonded wafer W500c, and a plurality of piezoelectric devices 200c is formed on the bonded wafer W500c. Through holes 226a, which serve as the castellations 226 (see FIG. 8), are formed on the second wafer W400c. In addition, because the surface of the second wafer W400c on the -Y'-axis side does not have the mounting terminals 224 formed thereon, the bonding status of the adhesive agents 150 formed between the piezoelectric wafer W230 and the first wafer W300c and between the piezoelectric wafer W230 and the second wafer W400c can be observed from the surface of the bonded wafer W500c on the -Y'-axis side. The observation can be carried out visually or using the imaging element 160.

In Step S208, the formation of the mounting terminals 224 is determined. Since the mounting terminals 224 are not formed in FIG. 17B, Step S211 is performed. In Step S211, the mounting terminals 224 are formed on the bonded wafer W500c. By forming the mounting terminals 224 in Step S211 and forming the electrodes on the through holes 226a of the second wafer W400c, the mounting terminals 224 are electrically connected with the extraction electrodes 232. After the mounting terminals 224 are formed in step S211, Step S209 is performed.

In Step S209, the bonded wafer W500c formed by bonding the piezoelectric wafer W230, the first wafer W300c, and the second wafer W400c is separated. The cutting is carried out by dicing along the scribe lines 115, so as to form individual piezoelectric devices 200c. Further, in Step S210, the bonding status of the adhesive agent 150 in the piezoelectric device 200c is inspected.

Figure 17C:
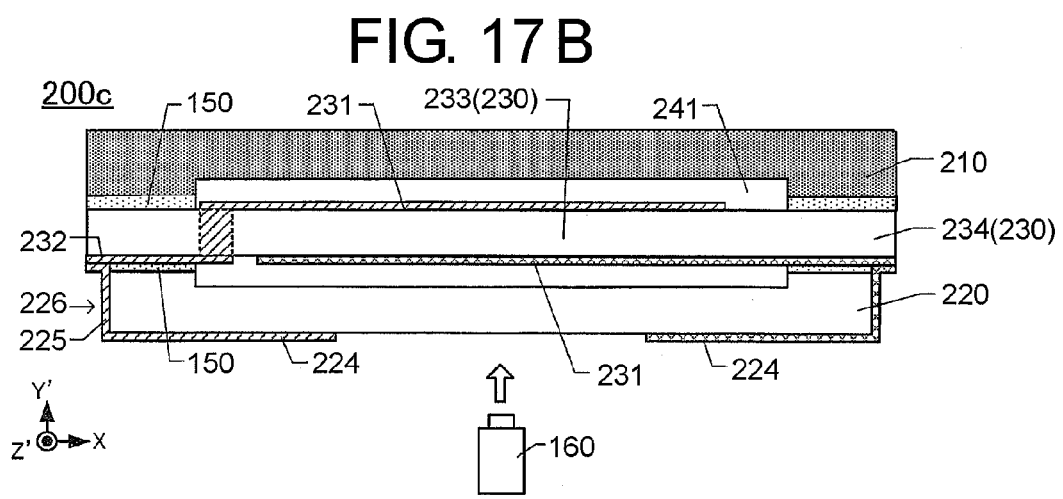
FIG. 17C is a cross-sectional view of the piezoelectric device 200c.

FIG. 17C is a cross-sectional view of the piezoelectric device 200c. FIG. 17C is also the cross-sectional view of FIG. 8 along the line C-C. Referring to FIG. 17C, the bonding status of the bonding surfaces between the lid 210 and the adhesive agent 150 and between the base 220 and the adhesive agent 150 can be inspected by observing the piezoelectric device 200c from the -Y'-axis side surface. In order to prevent the mounting terminals 224 from hindering the inspection of the bonding surfaces between the adhesive agent 150 and the lid 210 and between the adhesive agent 150 and the base 220, an overlapping area between the adhesive agent 150 and the mounting terminals 224 in the Y'-axis direction is preferably reduced.

Manufacturing method of the piezoelectric device 200c is also applicable to the piezoelectric device 200a in which the adhesive agent 150 is colored. In that case, for the inspection of the bonding status of the adhesive agent 150 in Step S205 (see FIG. 14A) and Step S207 (see FIG. 15A) of FIG. 10, the wafer can be easily observed from both surfaces on the +Y'-axis side and the -Y'-axis side since the mounting terminals 224 are not formed.

(Third Embodiment)

A piezoelectric device can also be formed without using the adhesive agent 150. The following describes a piezoelectric device 300, which does not use the adhesive agent 150. In the following paragraphs, elements the same as those of the first embodiment are referred to by the same reference numerals, and detailed descriptions thereof are omitted hereinafter.

<Structure of Piezoelectric Device 300>

Figure 18:
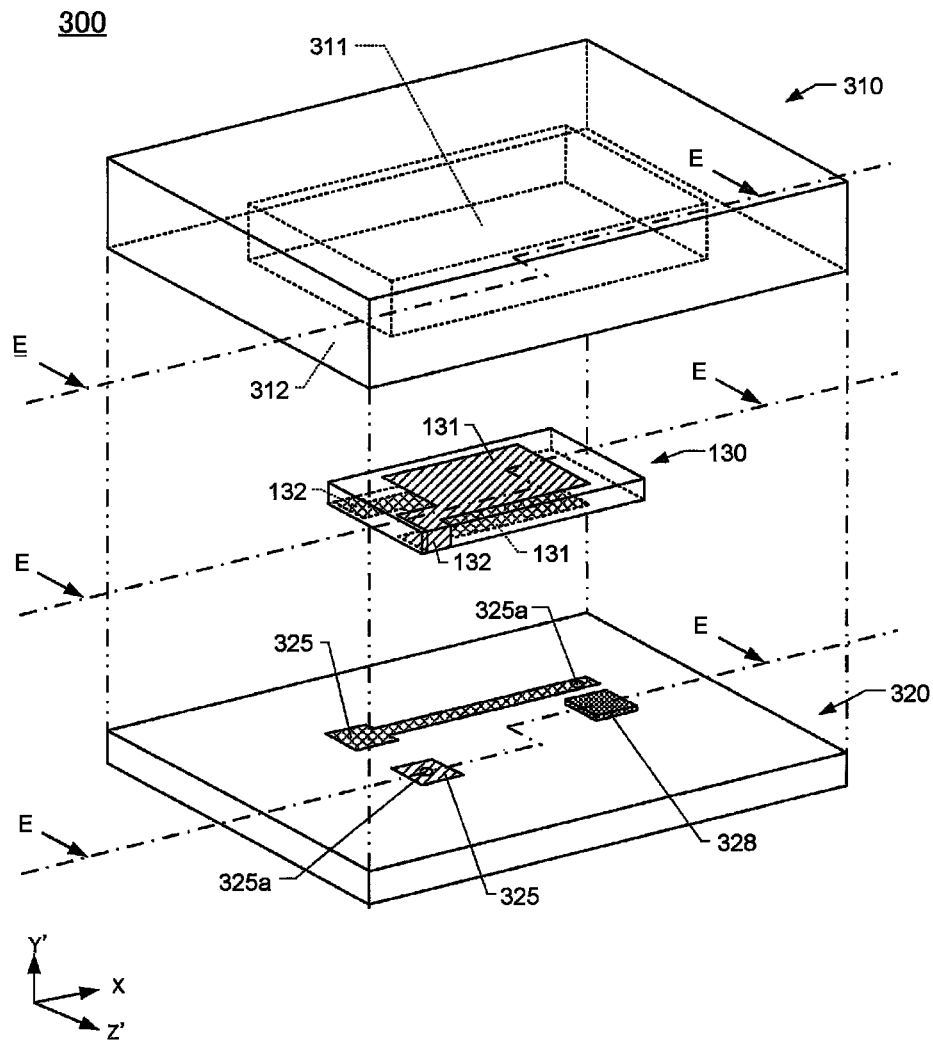
FIG. 18 is an exploded perspective view of a piezoelectric device 300.

FIG. 18 is an exploded perspective view of the piezoelectric device 300. The piezoelectric device 300 mainly includes the piezoelectric vibrating piece 130, a first plate 310, and a second plate 320. In the piezoelectric device 300, the first plate 310 serves as the lid, and the second plate 320 serves as the base. An electrically-insulating material, such as glass, is used to form the first plate 310 and the second plate 320.

In the piezoelectric device 300, the piezoelectric vibrating piece 130 is placed on the +Y'-axis surface of the second plate 320. Moreover, the first plate 310 is bonded to the second plate 320 on the +Y'-axis side in a way to seal the piezoelectric vibrating piece 130, so as to form the piezoelectric device 300.

The second plate 320 is formed into a plate shape. A pair of connection electrodes 325 are formed on a surface of the second plate 320 on the +Y'-axis side to electrically connect with the extraction electrodes 132 of the piezoelectric vibrating piece 130. A pair of mounting terminals 324 (see FIG. 19) are formed on a surface of the second plate 320 on the -Y'-axis side. The pair of connection electrodes 325 and the pair of mounting terminals 324 are electrically connected with each other via a through electrode 325a (see FIG. 19). In addition, a pillow 328 is formed on the surface of the second plate 320 on the +Y'-axis side for preventing damage of the piezoelectric vibrating piece 130 when the piezoelectric device 300 is under shock.

A concave 311 is formed on a surface of the first plate 310 on the −Y'-axis side, and a bonding surface 312 is formed surrounding the concave 311. The first plate 310 is bonded to the second plate 320 via the bonding surface 312.

Figure 19:
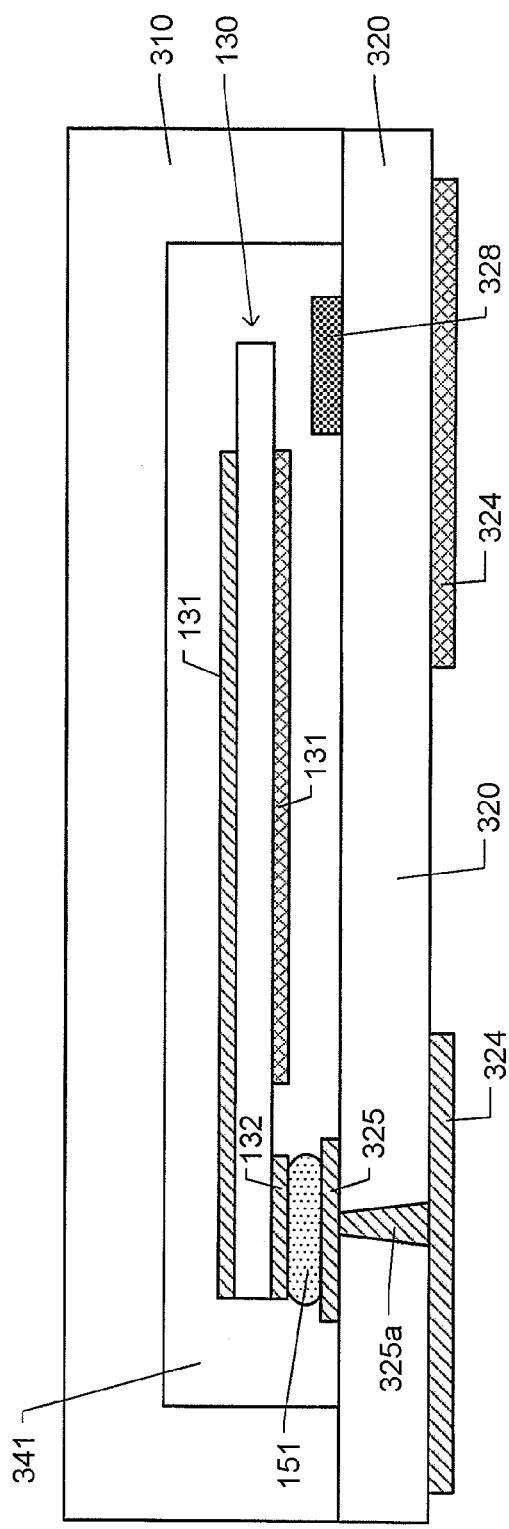
FIG. 19 is a cross-sectional view along Line E-E of FIG. 18.

FIG. 19 is a cross-sectional view along the line E-E of FIG. 18. The first plate 310 and the second plate 320 are directly bonded without using the adhesive agent 150. By bonding the first plate 310 and the second plate 320, a sealed cavity 341 is formed inside the piezoelectric device 300, and the piezoelectric vibrating piece 130 is disposed in the cavity 341. The extraction electrodes 132 of the piezoelectric vibrating piece 130 are electrically connected to the connection electrodes 325 through an electrically-conductive adhesive agent 151. Furthermore, the connection electrodes 325 are electrically connected to the mounting terminals 324 via the through electrode 325a that passes through the second plate 320. In other words, the excitation electrodes 131 of the piezoelectric vibrating piece 130 and the mounting terminals 324 are electrically connected, and the piezoelectric vibrating piece 130 vibrates by applying a voltage between the two mounting terminals 324.

The first plate 310 and the second plate 320 of the piezoelectric device 300 are formed by using glass as a base material, wherein one of the first plate 310 and the second plate 320 is colored and the other is transparent. By coloring one of the first plate 310 and the second plate 320, observation of the bonding status of the first plate 310 and the second plate 320 becomes easy. The same as the first embodiment, a color for the coloring is preferably a dark color, such as black or brown.

<Manufacturing Method of Piezoelectric Device 300>

Figure 20:
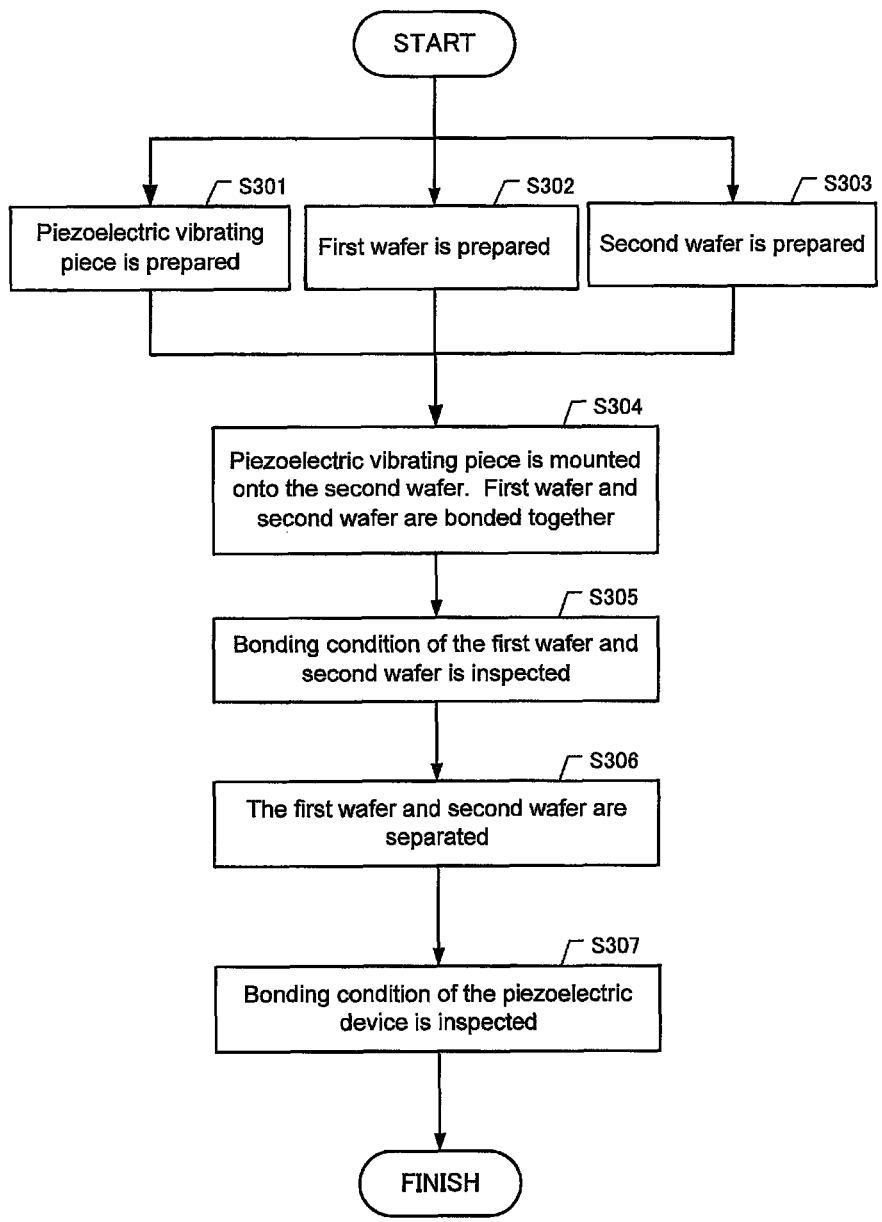
FIG. 20 is a flowchart showing a manufacturing method of the piezoelectric device 300.

FIG. 20 is a flowchart showing a manufacturing method of the piezoelectric device 300. The manufacturing method of the piezoelectric device 300 is explained below following the flowchart of FIG. 20.

In Step S301, a plurality of the piezoelectric vibrating pieces 130 is prepared. As shown in FIG. 18, excitation electrodes 131 and extraction electrodes 132 are formed on each of the piezoelectric vibrating piece 130 prepared in Step S301.

In Step S302, a first wafer W310 is prepared. The first wafer W310 is formed of glass, and a plurality of the first plates 310 is formed on the first wafer W310. The concave 311 of each of the first plates 310 is formed in the first wafer W310 for example by performing a sandblast or a machining process on a position where the concave 311 is to be formed.

In Step S303, a second wafer W320 is prepared. The second wafer W320 is formed of glass, and a plurality of the second plates 320 is formed on the second wafer W320. A through hole for forming the through electrode 325a is formed in each of the second plates 320 by such as a machining process which uses dry etching, sandblast, drill, or laser, etc. After forming the through hole, an underlying metal film, having a two-layer structure of titanium (Ti) and copper (Cu), is formed by sputtering on a side surface of the through hole and at the positions where the connection electrodes 325 and the mounting terminals 324 are to be formed. Further, an electrically-conductive material (copper (Cu), for example) is filled in the through hole by an electrolytic copper plating. In addition, for improving corrosion resistance, a surface finishing plating is performed to laminate a two-layer film of nickel (Ni) and gold (Au), or nickel (Ni) and tin (Sn) on a surface of the copper (Cu), so as to form a surface layer thereon. By performing screen printing several times on the surface of each of the second plates 320 on the +Y'-axis side, the pillow 328 is formed for absorbing shock to the piezoelectric vibrating piece 130 and preventing damage of the piezoelectric vibrating piece 130.

Aforementioned Steps S301-S303 can also be performed regardless of the sequence. In addition, one of the first wafer W310 and the second wafer W320 is colored and the other is transparent.

In Step S304, the piezoelectric vibrating piece 130 is disposed on the second wafer W320, and the first wafer W310 and the second wafer W320 are bonded to each other. The piezoelectric vibrating pieces 130 are electrically connected with the connection electrodes 325 of each of the first plates 310 on the first wafer W310 respectively via the electrically-conductive adhesive agent 151. Then, the first wafer W310 and the second wafer W320 are directly bonded.

Figure 21:
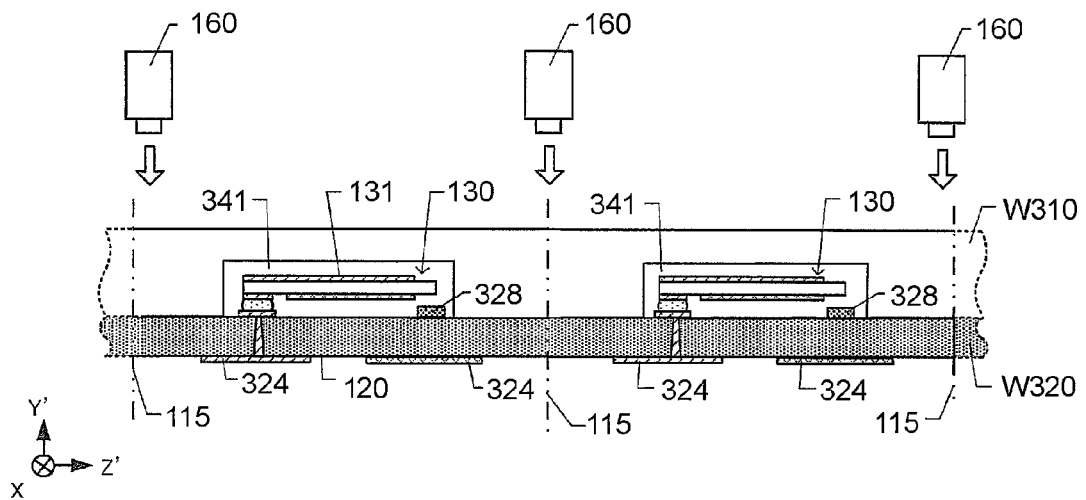
FIG. 21A is a cross-sectional view of a part of the first wafer W310 and the second wafer W320.
FIG. 21B is a cross-sectional view of a part of the first wafer W310 and the second wafer W320 when the first wafer W310 is colored.
Figure 21:
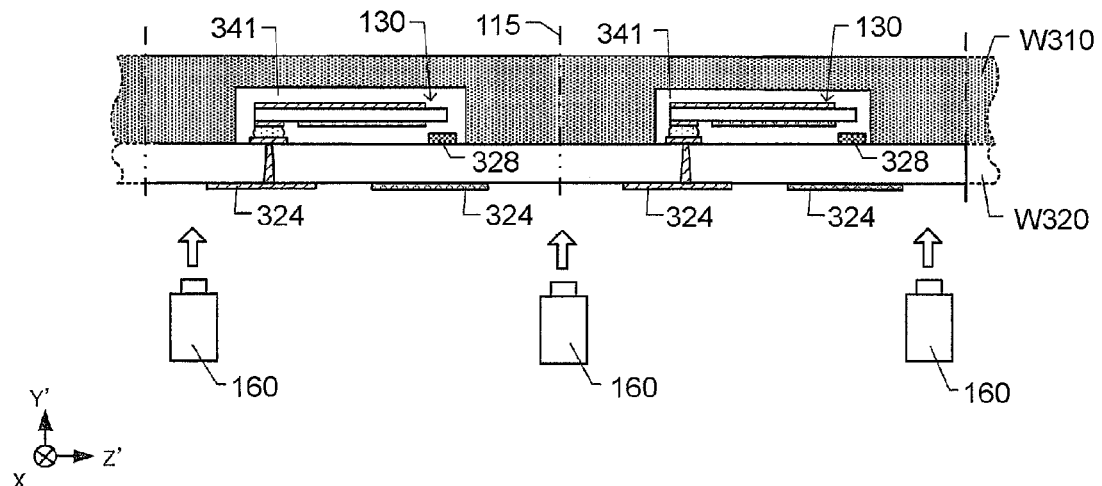

FIG. 21A is a cross-sectional view of a part of the first wafer W310 and the second wafer W320. The cross-sectional view in FIG. 21A is taken along the line E-E in FIG. 18 and illustrates the situation that the second wafer W320 is colored and the first wafer W310 is transparent. A bonding area on a surface of the first wafer W310 and a bonding area on a surface of the second wafer W320 are activated to directly bond the first wafer W310 and the second wafer W320. Hydroxyl group (—OH) is bonded to atoms on the surface of an ion-bonding material, such as sufficiently pure glass, etc., by electric charges carrying atoms, and a water molecule layer with about several molecules formed around the hydroxyl group. When the surfaces that are made sufficiently even and have ion bonding property contact each other, the hydroxyl group and water molecule bonded to the surfaces are bonded by hydrogen and generate an adhesive force to each other. As a result, the surfaces are bonded to each other without using the adhesive agent, etc. The first wafer W310 and the second wafer W320 are directly bonded to each other by the aforementioned surface activation, which requires no adhesive agent or the like for bonding.

In Step S305, the bonding status of the first wafer W310 and the second wafer W320 is inspected. As shown in FIG. 21A, in Step S305, the bonding surface between the first wafer W310 and the second wafer W320 is irradiated by an infrared ray, and the imaging element 160 is used to inspect the bonding status of the first wafer W310 and the second wafer W320 from the +Y'-axis side of the first wafer W310. In the case that the first wafer W310 and the second wafer W320 are not properly bonded, as shown in FIG. 6B, the bonding failure area 152 is detected by observing the discrepancy in the lights reflected from the bonded area and the bonding failure area 152. In the case that the foreign matter 170 is caught between the first wafer W310 and the second wafer W320, as shown in FIG. 6D, the inspection is carried out by observing the interference fringes 153, etc., around the foreign matter 170.

In Step S306, the first wafer W310 and the second wafer W320 are cut. In Step S306, the first wafer W310 and the second wafer W320 are cut by dicing along the scribe lines 115 (refer to FIG. 21A), so as to form individual piezoelectric devices 300.

In Step S307, the bonding status of the piezoelectric device 300 is inspected. The same as the piezoelectric device 100 in FIG. 7B, in Step S307, the inspection of the bonding status of the piezoelectric device 300 is carried out by observing the bonding area of the first wafer W310 and the second wafer W320 from the +Y'-axis side of the piezoelectric device 300. Breach and rupture, etc. that occur in Step S306 can be detected in Step S307.

FIG. 21B is a cross-sectional view of a part of the first wafer W310 and the second wafer W320 when the first wafer W310 is colored. It is also applicable if the first plate 310 of the piezoelectric device 300 is colored and the second plate 320 of the piezoelectric device 300 is transparent. In that case, in the Step S305 of FIG. 20, the bonding status of the first wafer W310 and the second wafer W320 is inspected from the −Y'-axis side of the second wafer W320. Preferably the mounting terminals 324 are formed in a way that the bonding area of the first wafer W310 and the second wafer W320 is covered by the mounting terminals as little as possible during the inspection.

Exemplary embodiments of the invention have been described in detail above. However, it is clear that modifications or variations may be made by those skilled in the art without changing the scope or spirit of the invention.

For example, a one-side-holding type piezoelectric vibrating piece with extraction electrodes extending to the −X-axis side is used in the piezoelectric device 100 and the piezoelectric device 300. However, a two-side-holding type piezoelectric vibrating piece having extraction electrodes extending to both the −X-axis side and the +X-axis side is also applicable.

Moreover, the piezoelectric vibrating piece in the described embodiments is an AT-cut crystal vibrating piece; however, a BT-cut crystal vibrating piece, etc., which also vibrates by thickness-shear mode, is also suitable. In addition, a tuning-fork-type crystal vibrating piece is suitable as well. Furthermore, a material of the piezoelectric vibrating piece is not limited to crystal material. $LiTaO_3$, $LiNbO_3$, or a piezoelectric material that contains piezoelectric ceramics is generally suitable.

What is claimed is:

1. A piezoelectric device, comprising:
   a container, comprising a first plate and a second plate formed of crystal or glass; and
   a piezoelectric vibrating piece that vibrates by applying a voltage, and at least a portion of the piezoelectric vibrating piece being stored in the container;
   wherein the first plate is bonded to a portion of the container, which excludes the first plate, via an adhesive agent, and one of the first plate, the second plate, and the adhesive agent is colored.

2. The piezoelectric device according to claim 1, wherein the portion of the container, which excludes the first plate, is the second plate.

3. The piezoelectric device according to claim 1, wherein:
   the piezoelectric vibrating piece comprises a piezoelectric vibrating portion that vibrates by applying a voltage and a frame body that surrounds the piezoelectric vibrating portion; and
   the container is formed by bonding the first plate and the second plate respectively to two principal surfaces of the frame body via the adhesive agent.

4. The piezoelectric device according to claim 1, wherein the adhesive agent is formed of a low-melting-point glass that melts at a temperature between 350° C.-410° C.

5. The piezoelectric device according to claim 1, wherein a color of the first plate, the second plate, and the adhesive agent being colored absorbs over 50% of each wavelength of an incident visible light.

6. A piezoelectric device, comprising:
   a piezoelectric vibrating piece that vibrates by applying a voltage; and
   a first plate and a second plate, formed of glass or crystal that seals the piezoelectric vibrating piece;
   wherein the first plate or the second plate is colored, and the first plate and the second plate are directly bonded to each other.

7. The piezoelectric device according to claim 6, wherein a surface of the first plate and a surface of the second plate are activated to directly bond the first plate with the second plate.

8. The piezoelectric device according to claim 6, wherein a color of the first plate or the second plate being colored absorbs over 50% of each wavelength of an incident visible light.

* * * * *